(12) United States Patent
Kunitani et al.

(10) Patent No.: US 7,259,599 B2
(45) Date of Patent: Aug. 21, 2007

(54) SEMICONDUCTOR DEVICE

(75) Inventors: Hisao Kunitani, Kyoto (JP); Satoru Tanigawa, Kawanishi (JP); Hiroshi Sonobe, Mishima-gun (JP); Atsuhisa Kageyama, Ibaraki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 66 days.

(21) Appl. No.: 10/541,678

(22) PCT Filed: Nov. 19, 2004

(86) PCT No.: PCT/JP2004/017296

§ 371 (c)(1),
(2), (4) Date: Jul. 8, 2005

(87) PCT Pub. No.: WO2005/050843

PCT Pub. Date: Jun. 2, 2005

(65) Prior Publication Data

US 2006/0146891 A1    Jul. 6, 2006

(30) Foreign Application Priority Data

Nov. 20, 2003  (JP) .............................. 2003-391461

(51) Int. Cl.
*H03L 7/00* (2006.01)

(52) U.S. Cl. ...................... 327/141; 327/144; 327/145; 327/147; 327/149; 327/150; 327/152; 327/153; 327/158; 327/163

(58) Field of Classification Search ................ 327/141
See application file for complete search history.

(56) References Cited

U.S. PATENT DOCUMENTS

| 6,342,796 | B2* | 1/2002 | Jung ........................ 327/141 |
| 6,437,618 | B2* | 8/2002 | Lee .......................... 327/158 |
| 6,603,337 | B2* | 8/2003 | Cho .......................... 327/149 |
| 6,825,644 | B2* | 11/2004 | Kernahan et al. ........... 323/283 |
| 6,985,016 | B2* | 1/2006 | Chow et al. ................ 327/149 |
| 7,027,548 | B1* | 4/2006 | Palusa et al. ............... 375/375 |
| 7,091,760 | B1* | 8/2006 | Chang et al. ............... 327/158 |
| 2002/0140472 | A1* | 10/2002 | Sonobe ...................... 327/158 |
| 2006/0071698 | A1* | 4/2006 | Parikh ........................ 327/231 |
| 2006/0202729 | A1* | 9/2006 | Gomm et al. ............... 327/231 |

FOREIGN PATENT DOCUMENTS

| JP | 62-188483 | 8/1987 |
| JP | 2002-290218 | 10/2002 |

* cited by examiner

*Primary Examiner*—Tuan T. Lam
*Assistant Examiner*—Hiep Nguyen
(74) *Attorney, Agent, or Firm*—Wenderoth, Lind & Ponack, L.L.P.

(57) ABSTRACT

In a semiconductor device of the present invention, a clock is not changed instantaneously but it is changed over maximum N+1/M clocks (N: integer not less than 2) by shifting delay cells in a step by step manner to make the phase state of a previous reference signal and the phase state of a present reference signal coincide with each other, whereby the clock is synchronized with the reference signal with accuracy, and the duty of the output clock is kept constant. With this semiconductor device, it is possible to prevent the duty of the clock from being discontinuous when a signal whose reference signal does not coincide with the clock is inputted and reset is made to a rising edge of this reference signal.

10 Claims, 21 Drawing Sheets

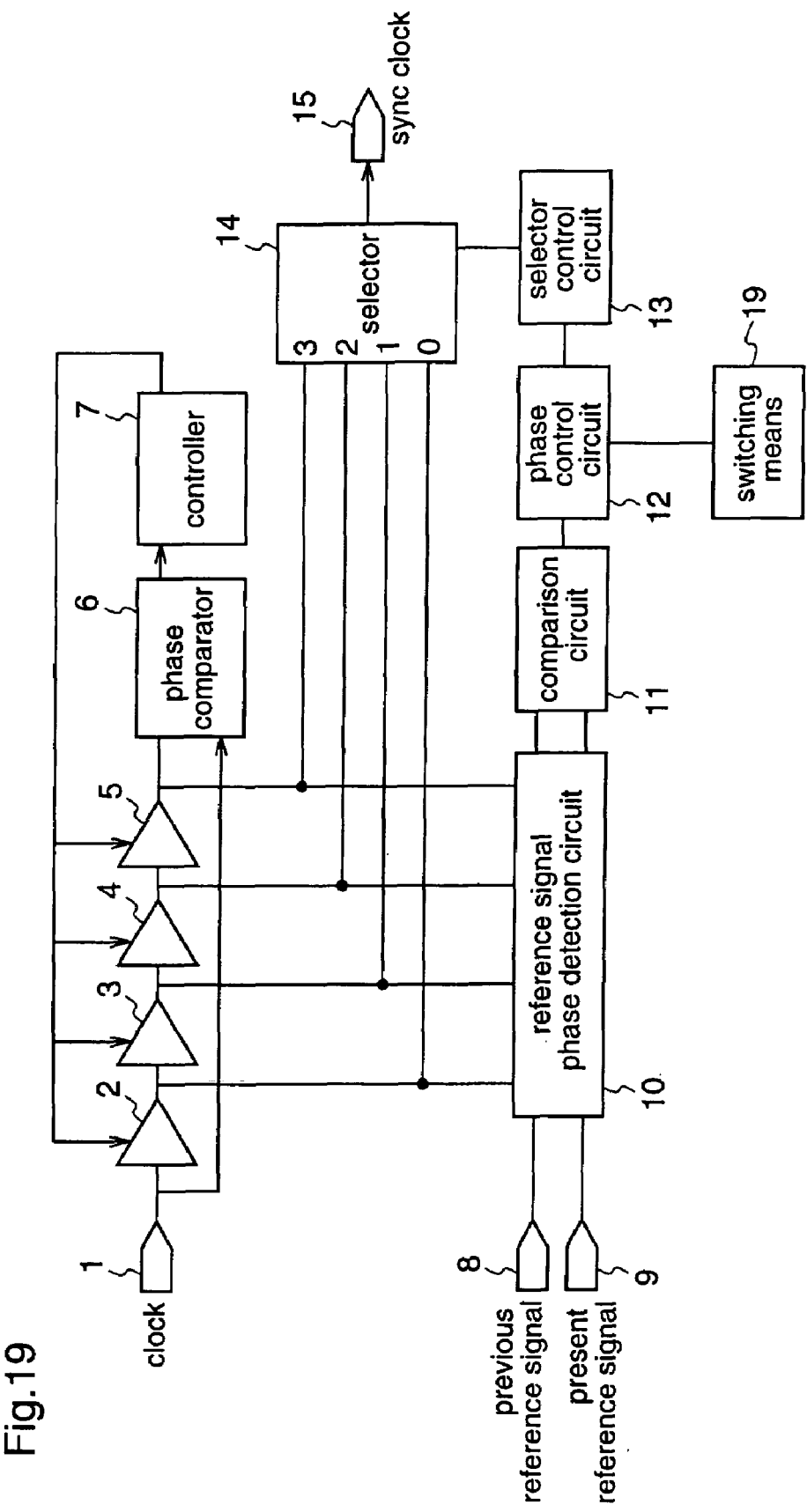

SEMICONDUCTOR DEVICE

TECHNICAL FIELD

The present invention relates to a semiconductor device for synchronizing a clock signal with a reference signal such as a horizontal sync signal in a video signal.

BACKGROUND ART

In recent years, digitization of video signal processing has been advanced, and a semiconductor device which performs video signal processing using a clock synchronized with a reference signal such as a horizontal sync signal has been utilized. As an example, there is a semiconductor device disclosed in Japanese Published Patent Application No. 2002-290218.

FIG. 21 shows a configuration example of such conventional semiconductor device.

A conventional semiconductor device shown in FIG. 21(a) includes a clock input terminal 101, delay cells 102 to 105, a phase comparator 106, a controller 107, a reference signal input terminal 108, a selector 109, and a sync clock output terminal 110.

The delay cells 102 to 105 shift the phase of a clock inputted to the clock input terminal 101, each by 1/4 clock.

The phase comparator 106 compares the phase of a clock that is one clock after the input clock with the phase of the output clock of the delay cell 105.

The controller 107 controls the delay values of the delay cells 102 to 105 on the basis of the output of the phase comparator 106.

The selector 109 selects, as a sync clock, a clock whose phase is closest to the phase of the reference signal inputted to the reference signal input terminal 108 from among the clocks outputted from the respective delay cells 102 to 105, and outputs the sync clock through the sync clock output terminal 110 to the outside.

A description will be given of the operation of the conventional semiconductor device constructed as described above, with reference to FIG. 21(b).

A clock inputted to the clock input terminal 101 is delayed by the four stages of delay cells 102 to 105. Then, in the phase comparator 106, the phase of a clock that is one clock after the clock inputted to the clock input terminal 101 is compared with the phase of the clock outputted from the delay cell 105, and the delay values of the respective delay cells 102 to 105 are controlled by the controller 107 on the basis of a phase difference that is detected as a result of the comparison.

The selector 109 selects an edge clock which is a rear part of the reference signal and is closest to the phase of the reference signal, from among the delay clocks outputted from the respective delay cells 102 to 105. In this example, the clock outputted from the delay cell 103 is selected as a sync clock, and the sync signal is outputted through the sync clock output terminal 110.

DISCLOSURE OF THE INVENTION

Problems to be Solved by the Invention

However, in the case of a signal having a reference signal that is not synchronized with a clock, such as an analog H pulse, when reset is made to a rising edge of the reference signal, a clock whose phase is closest to the edge of the reset signal is selected instantaneously, whereby a position where the duty of the clock becomes discontinuous exists. Further, if the subsequent signal processing is carried out with the clock duty having the discontinuous portion, a signal might be dropped out during arithmetic operation, and thereby the timing constraint between the data and the clock cannot be satisfied.

The present invention is made to solve the above-described problems and has for its object to provide a semiconductor device which can accurately synchronize a clock with a reference signal, and can keep the duty of an outputted sync signal constant.

MEANS TO SOLVE THE PROBLEMS

In order to solve the above-mentioned problems, according to a first aspect of the present invention, there is provided a semiconductor device for phase-shifting an input clock using N stages of delay cells, each delaying the clock by 1/N of the period of the clock, selecting a clock which is most synchronized with a reference signal from among clocks outputted from the respective delay cells using a selector, and outputting the selected clock as a sync clock, and the semiconductor device comprises: a reference signal phase detection circuit for detecting phase states of a present reference signal and a previous reference signal on the basis of phase differences between the clocks which have been phase-shifted each by 1/N period and the present reference signal, and phase differences between the 1/N period phase-shifted clocks and the previous reference signal that is one line previous to the present reference signal; a comparison circuit for comparing the phase states of the present reference signal and the previous reference signal which are detected by the reference signal phase detection circuit; a phase control circuit for shifting the phase state of the present reference signal to make it coincide with the phase state of the previous reference signal, when the comparison circuit detects that the phase states of the present reference signal and the previous reference signal do not coincide with each other; and a selector control circuit for controlling the selector on the basis of the output of the phase control circuit.

Therefore, the duty of the outputted sync clock can always be kept constant. As a result, it is possible to significantly reduce the timing constraint at an interface with a subsequent LSI, and prevent missing of signals during calculation in signal processing, resulting in satisfied timing constraint between data and clocks.

According to a second aspect of the present invention, in the semiconductor device defined in the first aspect, the phase control circuit performs the phase control by counting up the number of clocks for each step.

Therefore, when the phase of the present reference signal is delayed in comparison with that of the previous reference signal, since the phase of the present reference signal can be made to coincide with the phase of the previous reference signal by advancing it in a stepwise manner, a sync clock can be selectively outputted using the phase-controlled reference signals, thereby the duty of the sync clock can always be kept constant.

According to a third aspect of the present invention, in the semiconductor device defined in the first aspect, the phase control circuit performs the phase control by counting down the number of clocks for each step.

Therefore, when the phase of the present reference signal is advanced in comparison with that of the previous reference signal, since the phase of the present reference signal can be made to coincide with the phase of the previous reference signal by delaying it in a stepwise manner, a sync clock can be selectively outputted using the phase-controlled reference signals, thereby the duty of the sync clock can always be kept constant.

According to a fourth aspect of the present invention, in the semiconductor device defined in the first aspect, the phase control circuit shifts the phase of the clock of the present reference signal at a clock rate interval equivalent to a $(1+N)/N$ clock so as to bring the phase of the present reference signal close to the phase of the previous reference signal.

Therefore, when the phases of the present reference signal and the previous reference signal do not coincide with each other, since the phase of the present reference signal can be made to coincide with the phase of the previous reference signal by shifting the phase of the clock of the present reference signal in a stepwise manner, the duty of the sync clock can always be kept constant.

According to a fifth aspect of the present invention, in the semiconductor device defined in the first aspect, the phase control circuit shifts the phase of the clock of the present reference signal at a clock rate interval equivalent to a $(N-1)/N$ clock so as to bring the phase of the present reference signal close to the phase of the previous reference signal.

Therefore, when the phases of the present reference signal and the previous reference signal do not coincide with each other, since the phase of the present reference signal can be made to coincide with the phase of the previous reference signal by shifting the phase of the clock of the present reference signal in a stepwise manner, the duty of the sync clock can always be kept constant.

According to a sixth aspect of the present invention, in the semiconductor device defined in the first aspect, the phase control circuit shifts the phase of the clock of the present reference signal so that the clock rate interval becomes equal to or larger than one clock to bring the phase of the present reference signal close to the phase of the previous reference signal.

Therefore, when the phases of the present reference signal and the previous reference signal do not coincide with each other, since the phase of the present reference signal can be made to coincide with the phase of the previous reference signal by shifting the phase of the clock of the present reference signal in a stepwise manner, the duty of the sync clock can always be kept constant.

According to a seventh aspect of the present invention, in the semiconductor device defined in the first aspect, the phase control circuit shifts the phase of the clock of the present reference signal so that the clock rate interval becomes equal to or smaller than one clock to bring the phase of the present reference signal close to the phase of the previous reference signal.

Therefore, when the phases of the present reference signal and the previous reference signal do not coincide with each other, since the phase of the present reference signal can be made to coincide with the phase of the previous reference signal by shifting the phase of the clock of the present reference signal in a stepwise manner, the duty of the sync clock can always be kept constant.

According to an eighth aspect of the present invention, in the semiconductor device defined in any of the first to seventh aspects, the phase control circuit counts the number of clocks clock by clock, and performs the phase control on the basis of the count value.

Therefore, the phase of the clock of the present reference signal can be controlled in units of clocks.

According to a ninth aspect of the present invention, in the semiconductor device defined in any of the first to seventh aspects, the phase control circuit counts the number of clocks in units of 1/M-lines (M: integer not less than 2), and performs the phase control on the basis of the count value.

Therefore, the phase of the clock of the present reference signal can be controlled in units of 1/M-lines.

According to a tenth aspect of the present invention, in the semiconductor device defined in any of the first to seventh aspects, the phase control circuit counts the number of clocks line by line, and performs the phase control on the basis of the count value.

Therefore, the phase of the clock of the present reference signal can be controlled in units of lines.

EFFECTS OF THE INVENTION

According to the semiconductor device of the present invention, a predetermined initial value is outputted as a quantization factor until the PLL is locked. When a signal that is not synchronized with the clock, e.g., an analog H pulse, is reset, the phase of the clock of the present reference signal is shifted to make it coincide with the phase state of the previous reference signal while securing the clock duty width. Therefore, the duty of the outputted sync clock can always be kept constant, whereby the timing constraint at an interface with a subsequent LSI can be significantly reduced, omission of signals during calculations in signal processing is avoided, and the timing constraint can be satisfied between data and clocks.

BRIEF DESCRIPTION OF THE DRAWINGS

FIG. 19 is a diagram illustrating a modification of a semiconductor device according to the present invention.

DESCRIPTION OF REFERENCE NUMERALS

Figure 1:
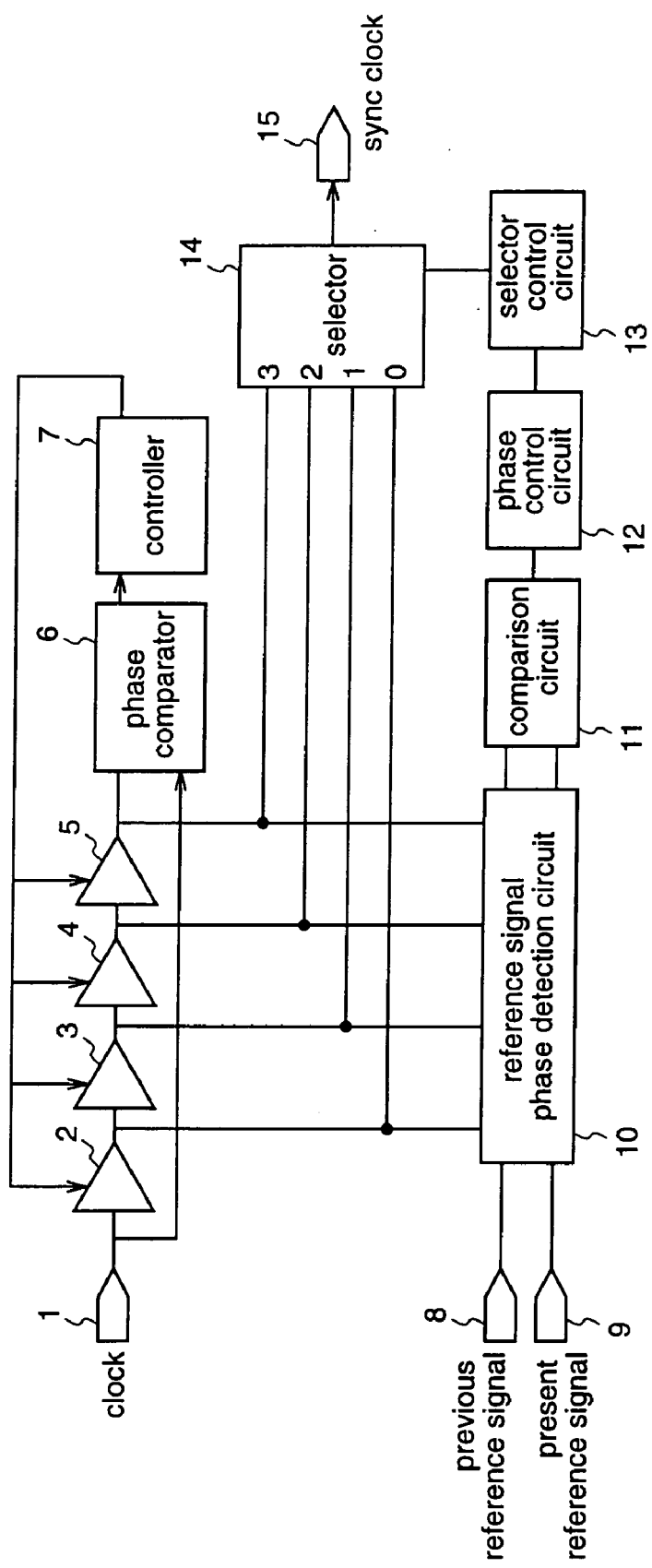
FIG. 1 is a diagram illustrating the construction of a semiconductor device according to a first embodiment of the present invention.

1 . . . clock input terminal
2~5 . . . delay cells
6 . . . phase comparator
7 . . . controller
8 . . . previous reference signal input terminal
9 . . . present reference signal input terminal
10 . . . reference signal phase detection circuit
11 . . . comparison circuit
12 . . . phase control circuit
13 . . . selector control circuit
14 . . . selector
15 . . . sync clock output terminal
16 . . . phase control circuit
17 . . . one-line width equal division counter circuit
18 . . . line counter circuit
19 . . . switching means
20 . . . subtracter
21 . . . selector
22 . . . selector
23 . . . adder
24 . . . selector
25 . . . flip-flop
26 . . . EX-OR circuit

BEST MODE TO EXECUTE THE INVENTION

Hereinafter, embodiments of the present invention will be described with reference to the drawings. The embodiments described hereinafter are merely examples, and the present invention is not restricted thereto.

Embodiment 1

FIG. 1 is a block diagram illustrating the construction of a semiconductor device according to a first embodiment of the present invention.

The semiconductor device according to the first embodiment comprises a clock input terminal 1, delay cells 2 to 5, a phase comparator 6, a controller 7, a previous reference signal input terminal 8, a present reference signal input terminal 9, a reference signal phase detection circuit 10, a comparison circuit 11, a phase control circuit 12, a selector control circuit 13, a selector 14, and a sync clock output terminal 15.

The delay cells 2 to 5 phase-shift a clock inputted to the clock input terminal 1, each by 1/4 a period of the clock.

The phase comparator 6 compares the phase of a clock that is one clock after the clock inputted from the clock input terminal with the phase of the output clock of the delay cell 5.

The controller 7 controls the delay values of the delay cells 2 to 5 on the basis of the output of the phase comparator 6.

The previous reference signal input terminal 8 receives a previous reference signal that is a signal one line prior to a present reference signal.

The present reference signal input terminal 9 receives the present reference signal.

The reference signal phase detection circuit 10 detects the phase states of the previous reference signal and the present reference signal on the basis of phase differences between the output clocks of the respective delay cells 2 to 5 and the previous reference signal that is inputted through the previous reference signal input terminal 8, and the phase differences between the output clocks of the respective delay cells 2 to 5 and the present reference signal that is inputted through the present reference signal input terminal 9.

The comparison circuit 11 checks whether the phase states of the present reference signal and the previous reference signal, which are detected by the reference signal phase detection circuit 10, coincide with each other or not.

When the phase states of the present reference signal and the previous reference signal do not coincide with each other, the phase control circuit 12 counts up the number of clocks on a step-by-step basis, thereby to shift the phase state of the clock of the present reference signal at a (1+N)/N clock rate interval (N: integer determined by the stage number of delay cells) to bring the phase state of the present reference signal close to the phase state of the previous reference signal. In this first embodiment, the phase control circuit 12 performs count-up on a clock-by-clock basis, and performs phase control at a 5/4 clock rate interval.

The selector control circuit 13 controls the selector 14 on the basis of the output of the phase control circuit 12.

The selector 14 is controlled by the selector control circuit 13 so as to select one from among the delay cells 2 to 5 as a sync clock, and outputs the selected clock through the sync clock output terminal 15 to the outside.

Figure 20:
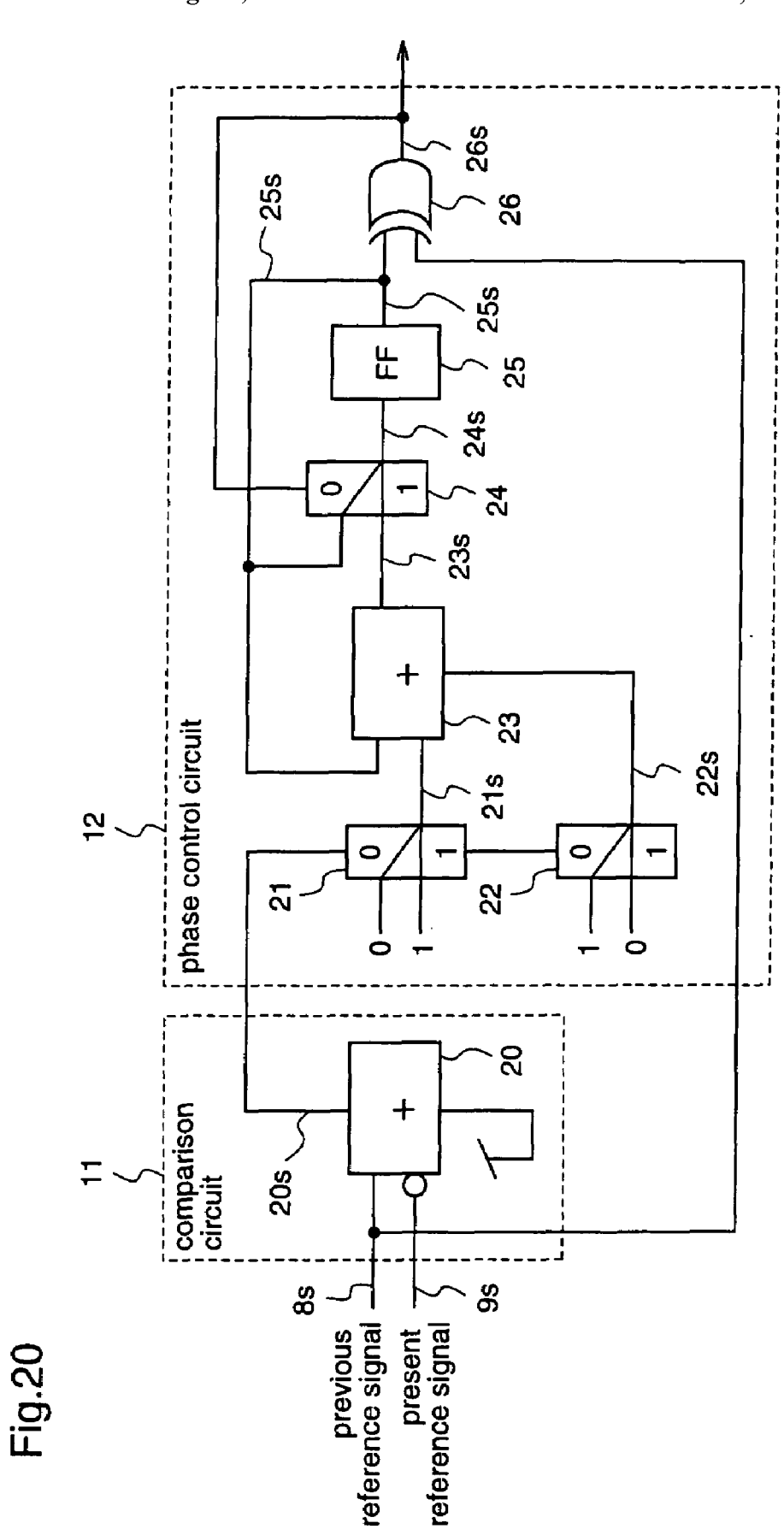
FIG. 20 is a diagram illustrating the detailed constructions of a comparison circuit and a phase control circuit as components of the semiconductor device according to the present invention.
Figure 21A:
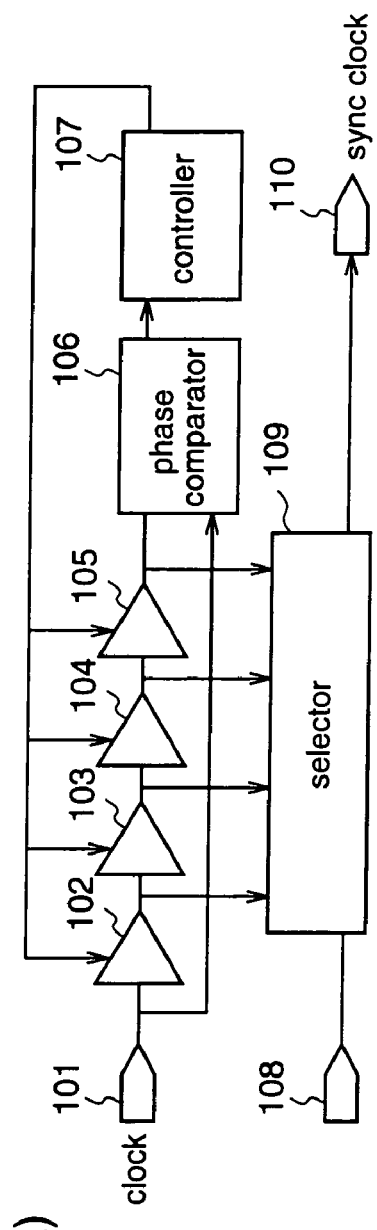
FIG. 21(a) is a diagram illustrating the construction of a conventional semiconductor device.
Figure 21B:
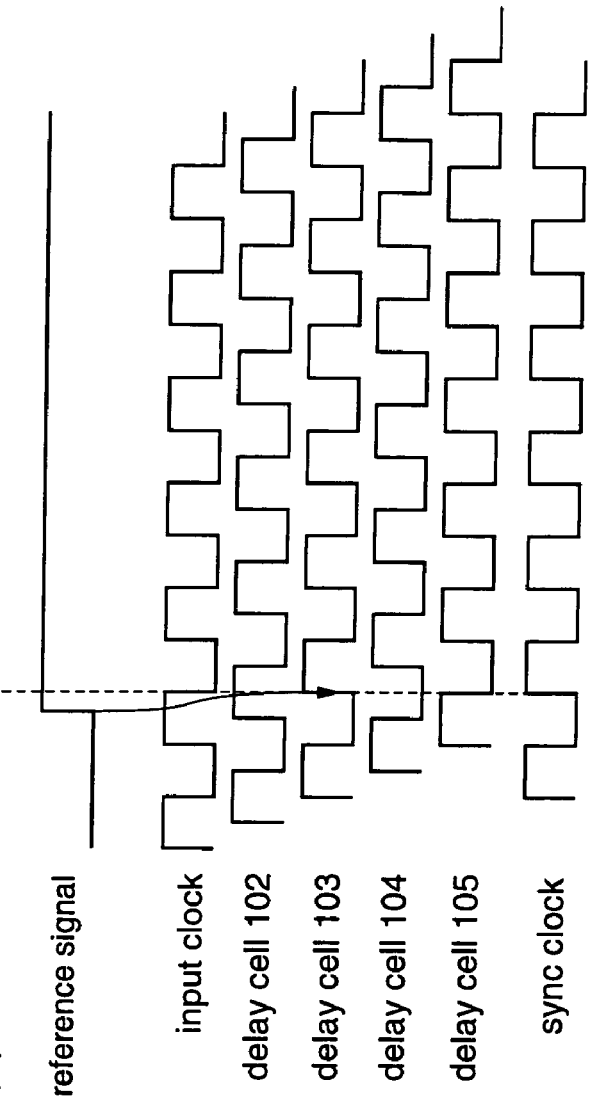
FIG. 21(b) is a diagram for explaining the operation of the conventional semiconductor device.

Next, examples of constructions of the comparison circuit 11 and the phase control circuit 12 are shown in FIG. 20.

The comparison circuit 11 includes a subtracter 20, judges as to which of the phase state 8s of the previous reference signal and the phase state 9s of the present reference signal is larger, and outputs a carry signal 20s on the basis of the result of judgement. This signal 20s indicates 1 when the phase state 8s of the previous reference signal is larger than the phase state 9s of the present reference signal, and indicates 0 when the phase state 8s of the previous reference signal is smaller than the phase state 9s of the present reference signal.

The phase control circuit 12 includes selectors 21 and 22, an adder 23, a selector 24, a flip-flop (FF) 25, and an EX-OR circuit 26, and performs phase control by an up-counting operation when the carry signal 20s is 1 while performs phase control by a down-counting operation when the carry signal 20s is 0.

The selector 21 outputs 1 when the carry signal 20s is 1, and outputs 0 when the carry signal 20s is 0.

The selector 22 outputs 0 when the carry signal 20s is 1, and outputs 1 when the carry signal 20s is 0.

The adder 23 adds the output 21s of the selector 21, the output 22s of the selector 22, and the output 25s of the flip-flop 25.

When the output 26s of the EX-OR circuit 26 is 1, the selector 24 selects the output 23s of the adder 23 and outputs it to the flip-flop 25. When the output 26s of the EX-OR circuit 26 is 0, since the output 25s of the flip-flop 25 coincides with the previous reference signal, the data is held.

The flip-flop 25 is a flip-flop with an asynchronous reset, and outputs 0 when reset is made.

The EX-OR circuit 26 compares the output 25s of the flip-flop 25 with the previous reference signal, and outputs 0 when there is a match, and outputs 1 when there is no match. In the subsequent selector control circuit 13, the selector circuit 14 is controlled at a timing when the output 26s of the EX-OR circuit 26 changes from 1 to 0.

The operation of the semiconductor device constructed as described above will be described.

Initially, a clock of the same frequency as that of a clock to be synchronized is input to the clock input terminal 1. The inputted clock is delayed by the delay cells 2 to 5, and the output clock of the delay cell 5 is input to the phase comparator 6 as a comparison signal. Further, the clock supplied from the clock input terminal 1 is input to the phase comparator 6 as a signal to be compared.

In the phase comparator 6, the phase of the output clock of the delay cell 5 is compared with the phase of the clock that is one clock after the clock inputted from the clock input terminal 1, and a phase difference output signal is outputted to the controller 7 when a phase difference is detected.

In the controller 7, the phase difference output signal is converted into a control value for controlling the delay values of the delay cells 2 to 5, thereby varying the delay values of the delay cells 2 to 5.

Thereafter, the phase comparator 6 compares the phase of the output clock of the delay cell 5 with the phase of the clock that is one clock after the clock inputted from the input terminal 1. This operation is repeated until the phase comparator 6 comes to detect no phase difference, and then there is no difference between the phase of the output clock of the delay cell 5 and the phase of the clock that is one clock after the clock inputted from the input terminal 1, i.e., the delays of the delay cells become approximately equal to each other. That is, a 1/4-clock phase-shifted clock is generated at the output of each delay cell. Accordingly, a 1/4-clock delayed clock is generated at the output of the delay cell 2, a 2/4-clock delayed clock is generated at the output of the delay cell 3, a 3/4-clock delayed clock is generated at the output of the delay cell 4, and a 1-clock delayed clock is generated at the output of the delay cell 5.

Next, a description will be given of a phase control method for a present reference signal by the semiconductor device according to the first embodiment of the present invention.

In the reference signal phase detection circuit 10, the phase states of the previous reference signal and the present reference signal are detected on the basis of the phase differences between the output clocks of the respective delay cells 2 to 5 and the reference signal, and the phase differences between the output clocks of the respective delay cells 2 to 5 and the present reference signal. The phase state 0 means that the phase state of the previous reference signal or the present reference signal is the same as the phase state of the output of the delay cell 2, and the count value by the phase control circuit 12 is 0. The phase state 1 means that the phase state of the previous reference signal or the present reference signal is the same as the phase state of the output of the delay cell 3, and the count value by the phase control circuit 12 is 1. The phase state 2 means that the phase state of the previous reference signal or the present reference signal is the same as the phase state of the output of the delay cell 4, and the count value by the phase control circuit 12 is 2. The phase state 3 means that the phase state of the previous reference signal or the present reference signal is the same as the phase state of the output of the delay cell 5, and the count value by the phase control circuit 12 is 3.

Figure 2A:
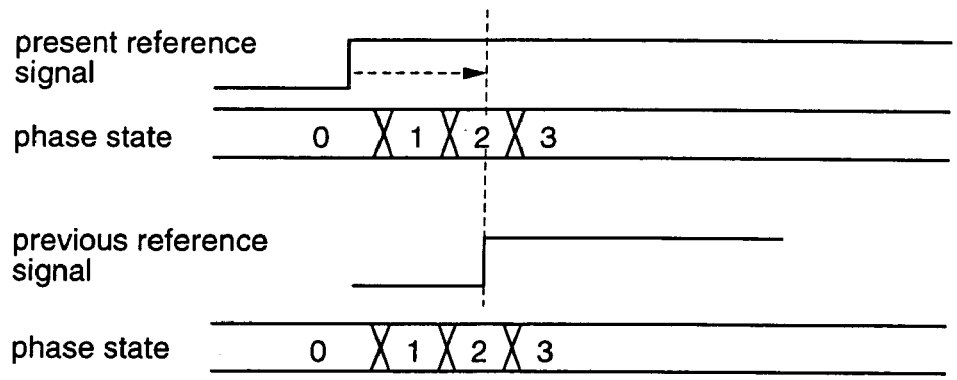
FIG. 2(a) is a diagram illustrating examples of phase states of a present reference signal and a previous reference signal in the semiconductor device according to the first embodiment.
Figure 2B:
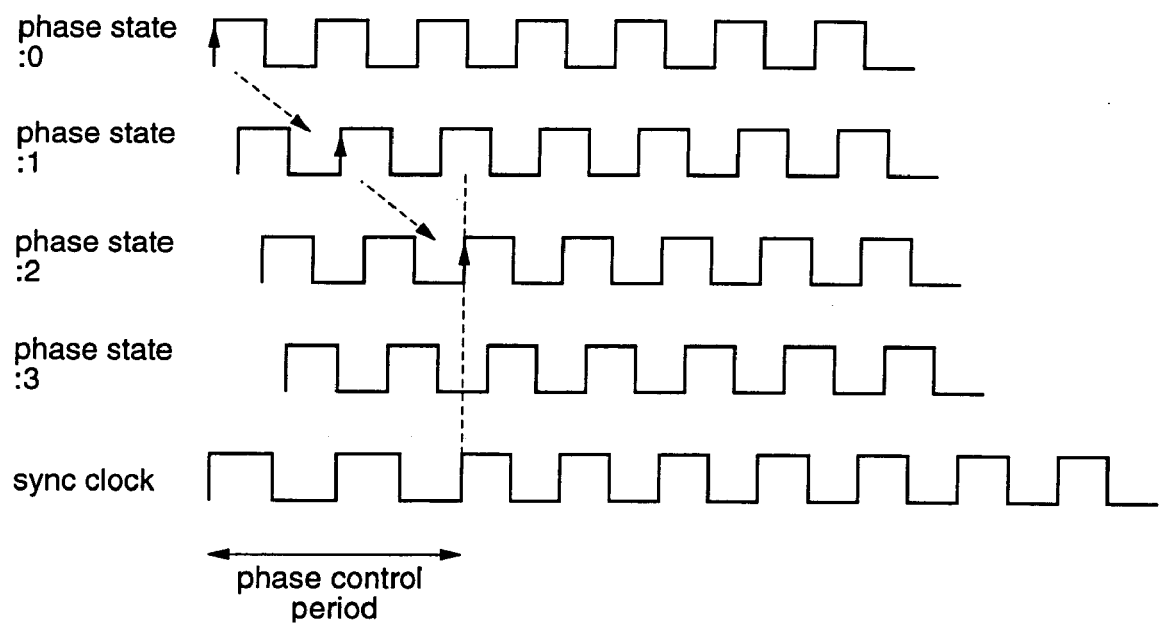
FIG. 2(b) is a diagram for explaining a method for performing phase control of the present reference signal shown in FIG. 2(a).

Based on the result of the above-mentioned detection, when the phase state of the previous reference signal is 2 and the phase state of the present reference signal is 0 as shown in FIG. 2(a), the phase control circuit 12 counts up the number of clocks clock by clock to shift the phase of the clock of the present reference signal at a 5/4 clock rate interval to bring the phase of the present reference signal close to the phase of the previous reference signal. That is, as shown in FIG. 2(b), the clock edge of the phase state 0 of the present reference signal is phase-shifted 5/4-clock by 5/4-clock to change the clock edge of the present reference signal to the clock edge of the phase state 1 and to the clock edge of the phase state 2, successively, whereby the phase state of the present reference signal is brought close to the phase state of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control, while it is outputted at a 1 clock rate interval after the phases of the previous reference signal and the present reference signal coincide each other, i.e., after the phase control is completed.

Figure 3A:
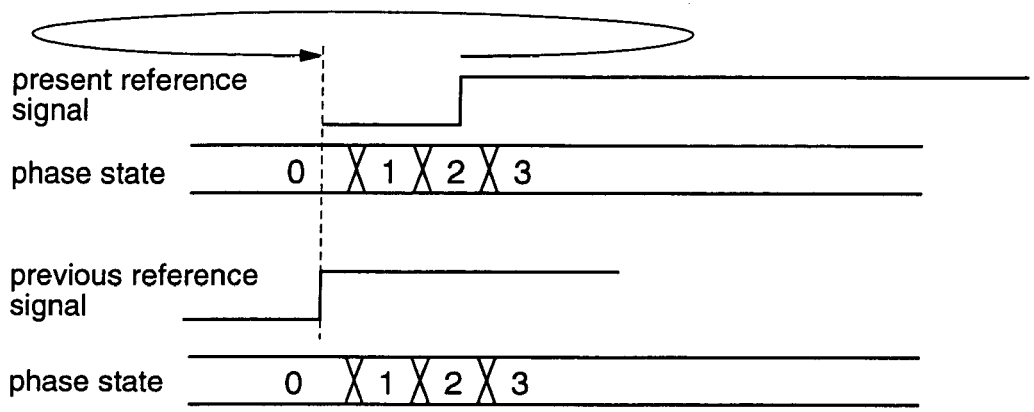
FIG. 3(a) is a diagram illustrating examples of phase states of a present reference signal and a previous reference signal in the semiconductor device according to the first embodiment.
Figure 3B:
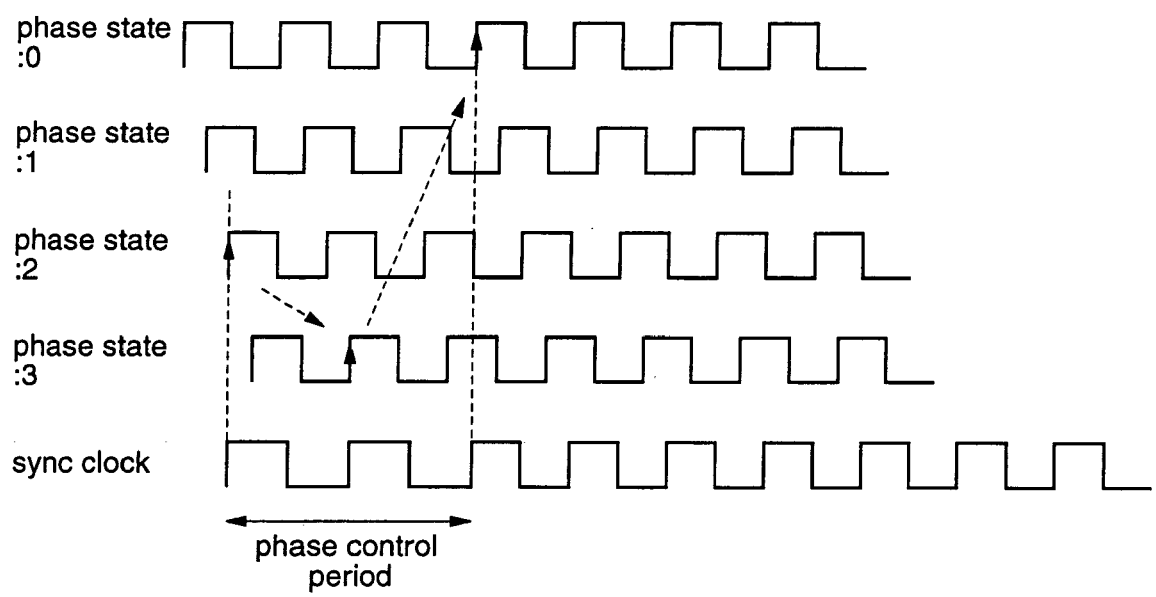
FIG. 3(b) is a diagram for explaining a method for performing phase control of the present reference signal shown in FIG. 3(a).

Based on the result of the above-mentioned detection, when the phase state of the previous reference signal is 0 and the phase state of the present reference signal is 2 as shown in FIG. 3(a), the phase control circuit 12 phase-shifts the clock edge of the phase state 2 of the present reference signal 5/4-clock by 5/4-clock as shown in FIG. 3(b) to change the clock edge of the present reference signal to the clock edge of the phase state 3 and to the clock edge of the phase state 0, successively, whereby the phase state of the present reference signal is brought close to the phase state of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control, and it is outputted at a 1 clock rate interval after the phases of the previous reference signal and the present reference signal coincide, i.e., after the phase control is completed.

In the first embodiment, the semiconductor device is provided with the phase control circuit 12 which performs phase control by counting up the number of clocks clock by clock to bring the phase state of the present reference signal close to the phase state of the previous reference signal, and the phase of the clock of the present reference signal is shifted at a 5/4 clock rate interval to make it coincide with the phase of the present reference signal when the signal that is not synchronized with the input clock, e.g., the analog H pulse, is reset. Therefore, the duty of the outputted sync clock can be kept constant, whereby the timing restriction at the interface with the subsequent LSI is significantly reduced, and the timing restriction between the data and the clock can be satisfied without losing signals during calculations in signal processing, and eventually, malfunction during signal processing can be avoided.

While in this first embodiment the phase control circuit 12 performs phase control at a (1+N)/N clock rate interval, the same effects as mentioned above can be obtained even when the clock rate interval is equal to or larger than one clock.

Embodiment 2

Figure 4:
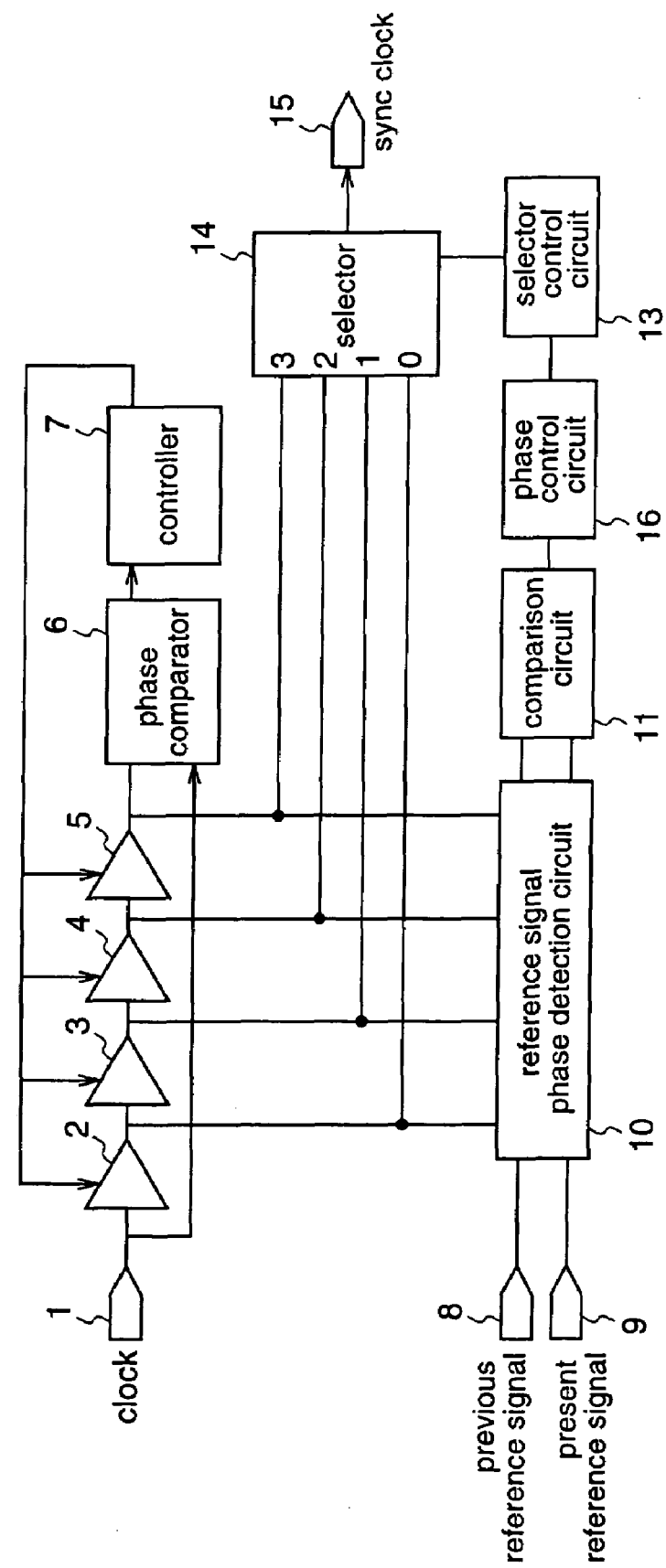
FIG. 4 is a block diagram illustrating the construction of a semiconductor device according to a second embodiment of the present invention.

FIG. 4 is a block diagram illustrating the construction of a semiconductor device according to a second embodiment of the present invention. In FIG. 4, the same reference numerals as those shown in FIG. 1 denote the same or corresponding components, and therefore, repeated description is not necessary.

The semiconductor device according to the second embodiment is provided with a phase control circuit 16 that performs phase control by counting down the number of clocks in a stepwise manner, instead of the phase control circuit 12 that performs phase control by counting up the number of clocks in a stepwise manner. When the phase states of the present reference signal and the previous reference signal do not coincide with each other, the phase control circuit 16 counts down the number of clocks in a stepwise manner to shift the phase state of the clock of the present reference signal with a (N−1)/N clock rate width so as to bring the phase state of the present reference signal close to the phase state of the previous reference signal. In this second embodiment, it is assumed that the phase control circuit 16 counts down the number of clocks on a clock-by-clock basis to perform phase control at a 3/4 clock rate interval.

Next, a description will be given of a phase control method for the present reference signal in the semiconductor device according to the second embodiment.

In the reference signal phase detection circuit 10, the phase states of the previous reference signal and the present reference signal are detected on the basis of the phase differences between the output clocks of the respective delay cells 2 to 5 and the previous reference signal, and the phase differences between the output clocks of the respective delay cells 2 to 5 and the present reference signal.

Figure 5A:
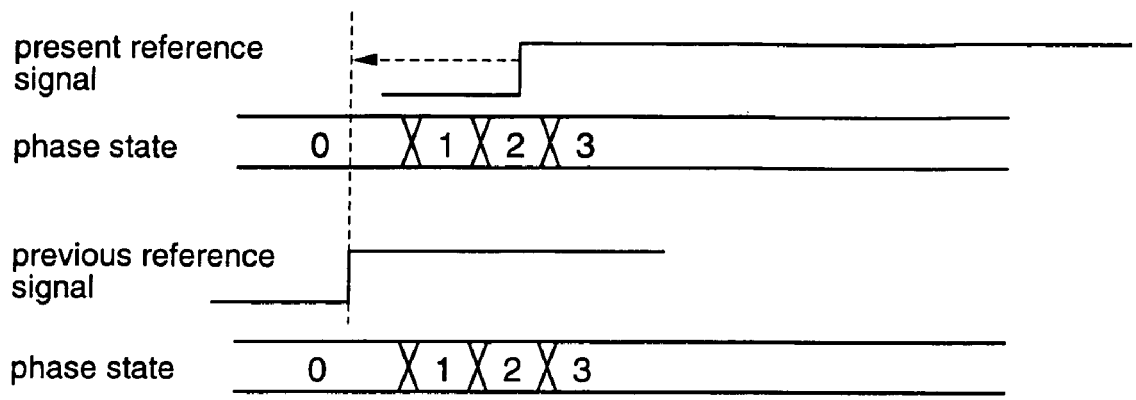
FIG. 5(a) is a diagram illustrating examples of phase states of a present reference signal and a previous reference signal in the semiconductor device according to the second embodiment.
Figure 5B:
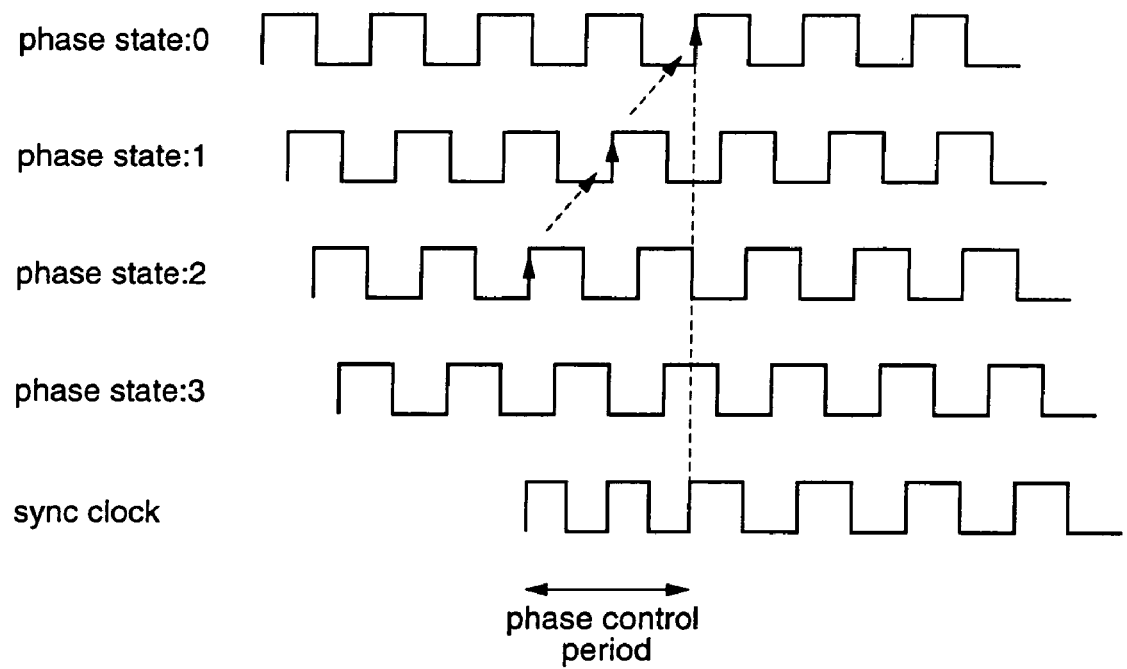
FIG. 5(b) is a diagram for explaining a method for performing phase control of the present reference signal shown in FIG. 5(a).

Based on the result of the detection, when the phase state of the previous reference signal is 0 and the phase state of the present reference signal is 2 as shown in FIG. 5(a), the phase control circuit 16 counts down the number of clocks clock by clock to bring the phase of the clock of the present reference signal close to the phase of the previous reference signal at a 3/4 clock rate interval. That is, as shown in FIG. 5(b), the clock edge of the present reference signal in the phase state 2 is phase-shifted 3/4-clock by 3/4-clock to change the clock edge of the present reference signal to the clock edge in the phase state 1 and to the clock edge in the phase state 0, successively, so as to bring the phase state of the present reference signal close to that of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control, and it is outputted at a 1 clock rate interval after the phases of the previous reference signal and the present reference signal coincide with each other, i.e., after the phase control is completed.

Figure 6A:
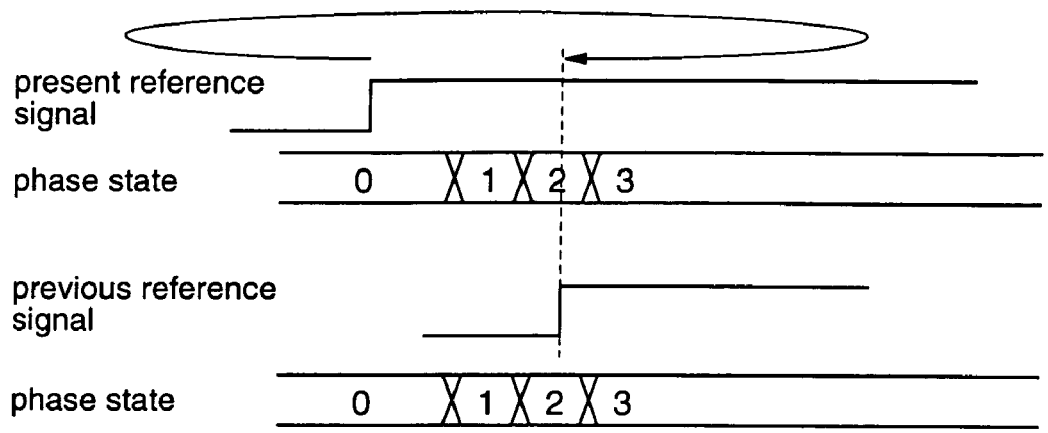
FIG. 6(a) is a diagram illustrating examples of phase states of a present reference signal and a previous reference signal in the semiconductor device according to the second embodiment.
Figure 6B:
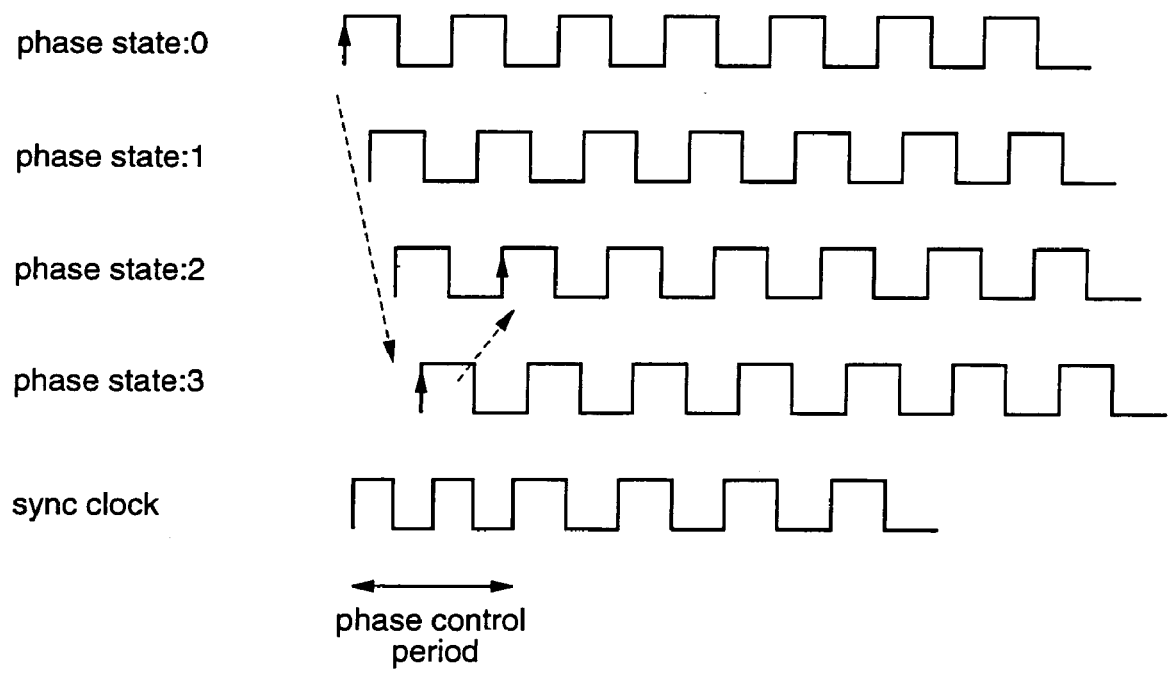
FIG. 6(b) is a diagram for explaining a method for performing phase control of the present reference signal shown in FIG. 6(a).

Based on the result of the detection, when the phase state of the previous reference signal is 2 and the phase state of the present reference signal is 0 as shown in FIG. 6(a), the phase control circuit 12 phase-shifts the clock edge of the present reference signal in the phase state 0 3/4-clock by 3/4-clock as shown in FIG. 6(b) to change the clock edge of the present reference signal to the clock edge in the phase state 3 and to the clock edge in the phase state 2, successively, thereby bringing the phase state of the present reference signal close to that of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control, and it is outputted at a 1 clock rate interval after the phases of the previous reference signal and the present reference signal coincide, i.e., after the phase control is completed.

According to the second embodiment, the semiconductor device is provided with the phase control circuit 16 which performs phase control by counting down the number of clocks clock by clock so as to bring the phase state of the present reference signal close to the phase state of the previous reference signal, and the phase of the clock of the present reference signal is shifted at a 3/4 clock rate interval to make it coincide with the phase of the previous reference signal when the signal that is not synchronized with the clock is reset. Therefore, the duty of the output sync clock can always be kept constant, whereby the timing constraint at an interface with a subsequent LSI can be significantly reduced, and omission of signals during calculations in signal processing is avoided, and consequently, the timing constraint can be satisfied between data and clocks.

While in this second embodiment the phase control circuit 16 phase-shifts the clock at a (N−1)/N clock rate interval, the same effects as mentioned above can be achieved so long as the clock rate interval is one clock or shorter.

Embodiment 3

Figure 7:
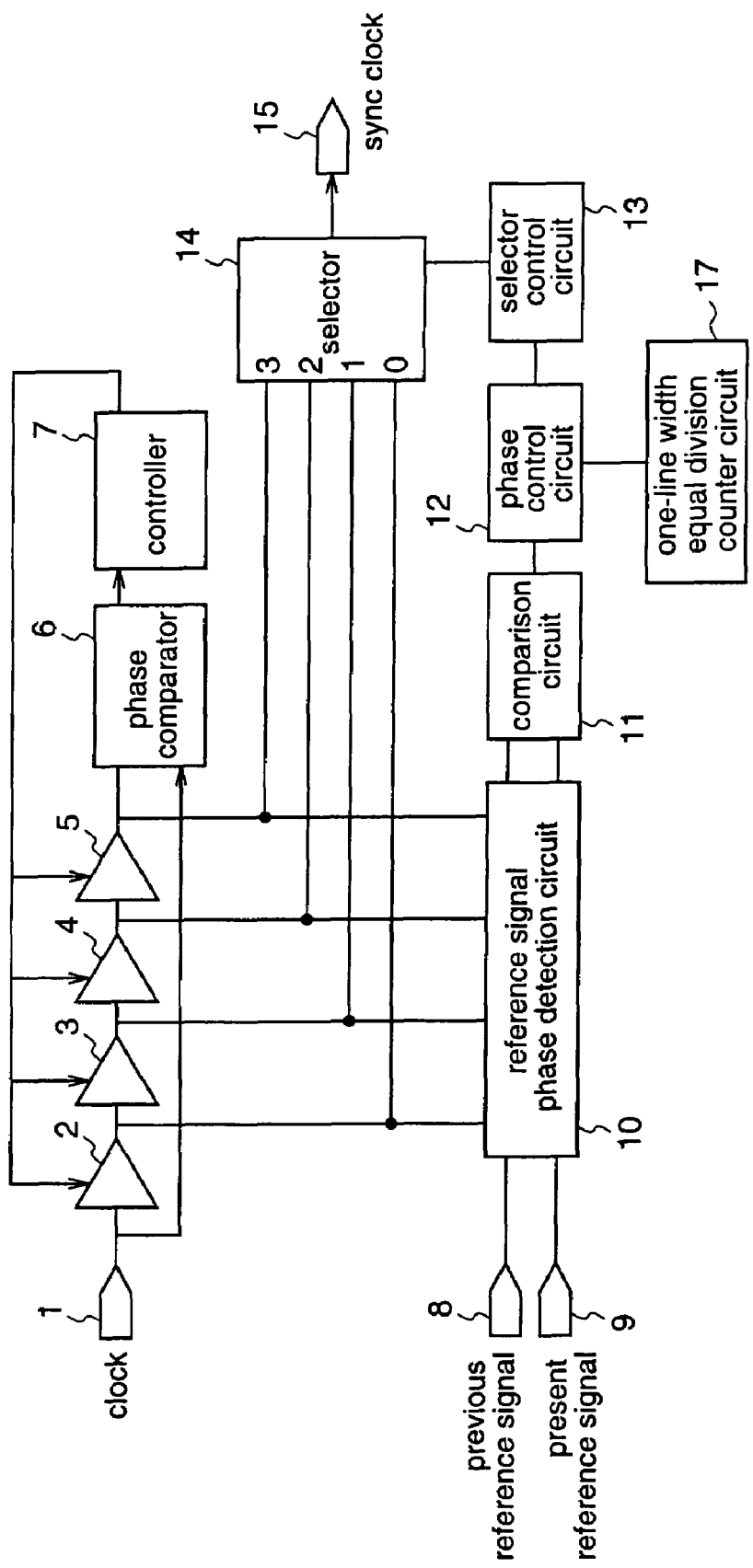
FIG. 7 is a block diagram illustrating the construction of a semiconductor device according to a third embodiment of the present invention.

FIG. 7 is a block diagram illustrating the construction of a semiconductor device according to a third embodiment of the present invention. In FIG. 7, the same reference numerals as those shown in FIG. 1 denote the same or corresponding components and, therefore, repeated description is not necessary.

The semiconductor device according to the third embodiment is provided with a one-line width equal division counter circuit 17 in addition to the components of the semiconductor device according to the first embodiment.

The one-line width equal division counter circuit 17 equally divides the line width by the number of clocks per line M (M: integer not less than 2), and controls the phase control circuit 12 so as to count the number of clocks in line units (1/M-line units) into which the line width is equally divided.

Next, a description will be given of a phase control method for the reference signal in the semiconductor device according to the third embodiment.

In the reference signal phase detection circuit 10, the phase states of the previous reference signal and the present reference signal are detected on the basis of the phase differences between the output clocks of the respective delay cells 2 to 5 and the previous reference signal, and the phase differences between the output clocks of the respective delay cells 2 to 5 and the present reference signal.

Figure 8A:
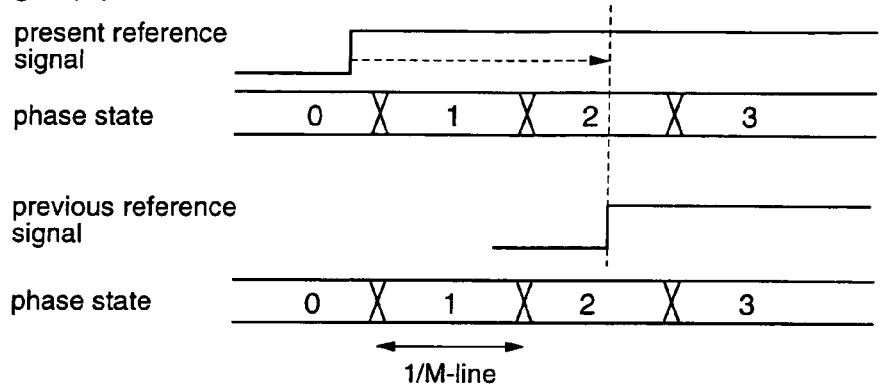
FIG. 8(a) is a diagram illustrating examples of phase states of a present reference signal and a previous reference signal in the semiconductor device according to the third embodiment.
Figure 8B:
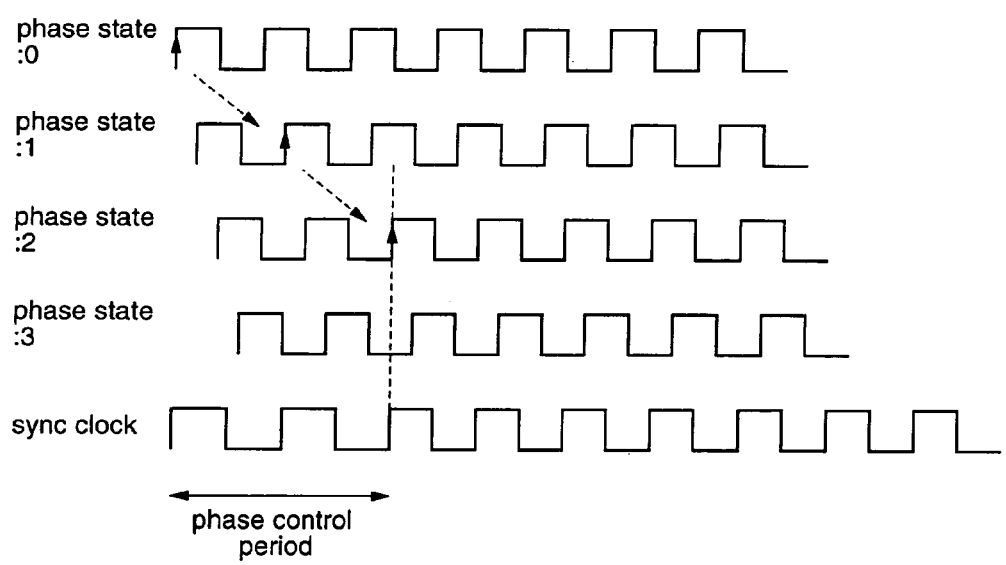
FIG. 8(b) is a diagram for explaining a method for performing phase control of the present reference signal shown in FIG. 8(a).

Based on the result of the detection, when the phase state of the previous reference signal is 2 and the phase state of the present reference signal is 0 as shown in FIG. 8(*a*), the phase control circuit 16 counts up the number of clocks in units of 1/M-lines to bring the phase of the clock of the present reference signal close to the phase of the previous reference signal at a 5/4 clock rate interval. That is, as shown in FIG. 8(*b*), the clock edge of the present reference signal in the phase state 0 is phase-shifted 5/4-clock by 5/4-clock to change the clock edge of the present reference signal to the clock edge in the phase state 1 and to the clock edge in the phase state 2, successively, thereby bringing the phase state of the present reference signal close to that of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control of the clock of the present reference signal, and it is outputted at a 1 clock rate interval after the phases of the previous reference signal and the present reference signal coincide with each other, i.e., after the phase control is completed.

Figure 9A:
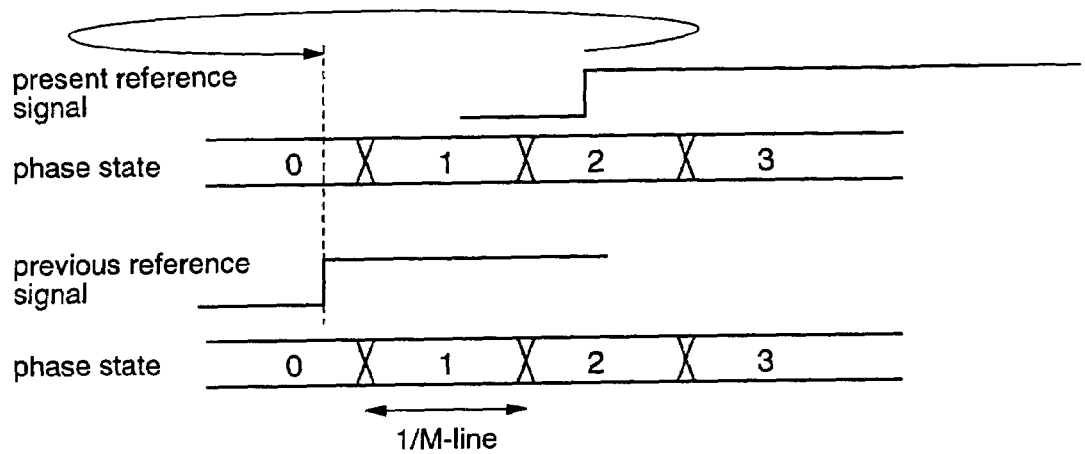
FIG. 9(a) is a diagram illustrating examples of phase states of a present reference signal and a previous reference signal in the semiconductor device according to the third embodiment.
Figure 9B:
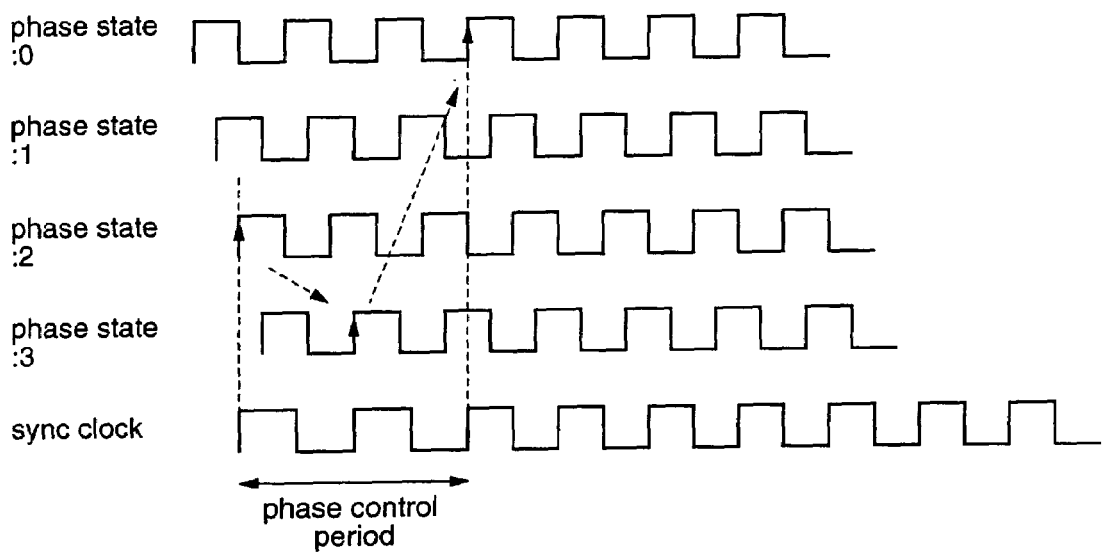
FIG. 9(b) is a diagram for explaining a method for performing phase control of the present reference signal shown in FIG. 9(a).

Based on the result of the detection, when the phase state of the previous reference signal is 0 and the phase state of the present reference signal is 2 as shown in FIG. 9(*a*), the phase control circuit 12 phase-shifts the clock edge of the present reference signal in the phase state 2 5/4-clock by 5/4-clock as shown in FIG. 9(*b*) to change the clock edge of the present reference signal to the clock edge in the phase state 3 and to the clock edge of the phase state 0, successively, thereby bringing the phase of the present reference signal close to the phase state of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control for the present reference signal, and it is outputted at a 1 clock rate interval after the phases of the previous reference signal and the present reference signal coincide, i.e., after the phase control is completed.

According to the third embodiment, the semiconductor device is provided with the phase control circuit 12 which performs phase control by counting up the number of clocks in units of 1/M-lines so as to bring the phase state of the present reference signal close to the phase state of the previous reference signal, and the phase of the clock of the present reference signal is shifted at a 5/4 clock rate interval to make it coincide with the phase of the previous reference signal when the signal that is not synchronized with the clock is reset. Therefore, the duty of the output sync clock can always be kept constant, whereby the timing constraint at an interface with a subsequent LSI can be significantly reduced, and omission of signals during calculations in signal processing is avoided, and consequently, the timing constraint can be satisfied between data and clocks.

Embodiment 4

Figure 10:
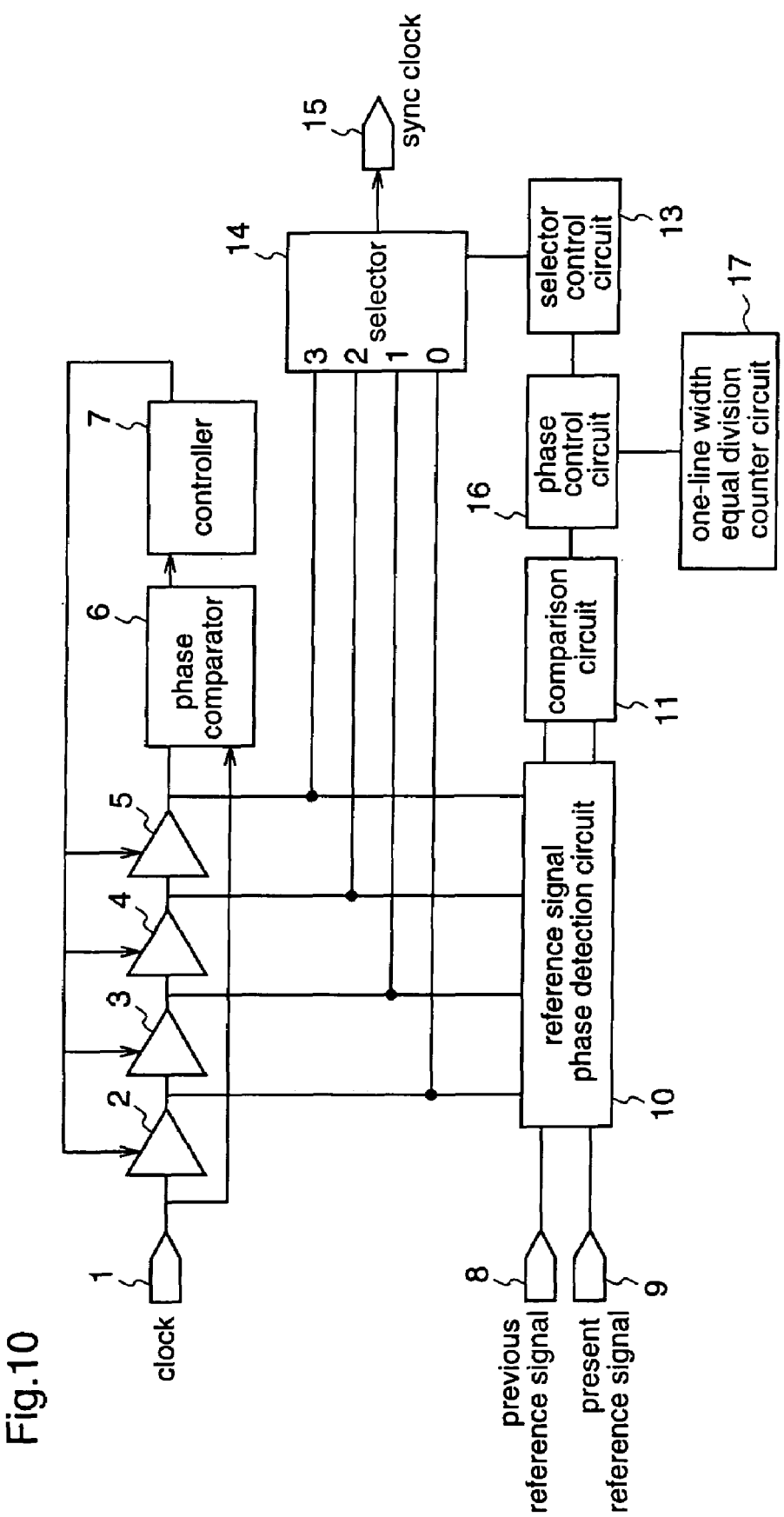
FIG. 10 is a block diagram illustrating the construction of a semiconductor device according to a fourth embodiment of the present invention.

FIG. 10 is a block diagram illustrating the construction of a semiconductor device according to a fourth embodiment of the present invention. In FIG. 10, the same reference numerals as those shown in FIG. 1 denote the same or corresponding components and, therefore, repeated description is not necessary.

The semiconductor device according to the fourth embodiment is provided with a one-line width equal division counter circuit 17 in addition to the components of the semiconductor device according to the second embodiment.

The one-line width equal division counter circuit 17 equally divides the line width by the number of clocks per line M (M: integer not less than 2), and controls the phase control circuit 16 so as to count the number of clocks in line units (1/M-line units) into which the line width is equally divided.

Next, a description will be given of a phase control method for the reference signal in the semiconductor device according to the fourth embodiment.

In the reference signal phase detection circuit 10, the phase states of the previous reference signal and the present reference signal are detected on the basis of the phase differences between the output clocks of the respective delay cells 2 to 5 and the previous reference signal, and the phase differences between the output clocks of the respective delay cells 2 to 5 and the present reference signal.

Figure 11A:
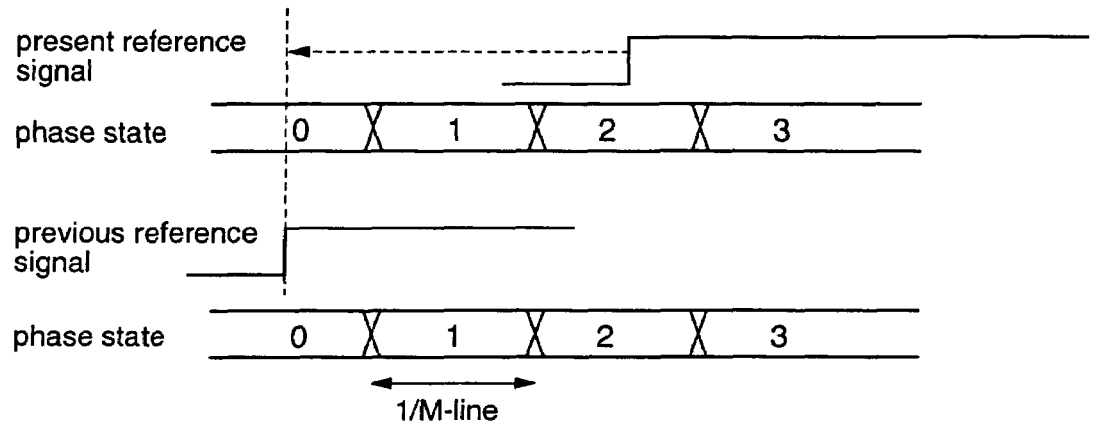
FIG. 11(a) is a diagram illustrating examples of phase states of a present reference signal and a previous reference signal in the semiconductor device according to the fourth embodiment.
Figure 11B:
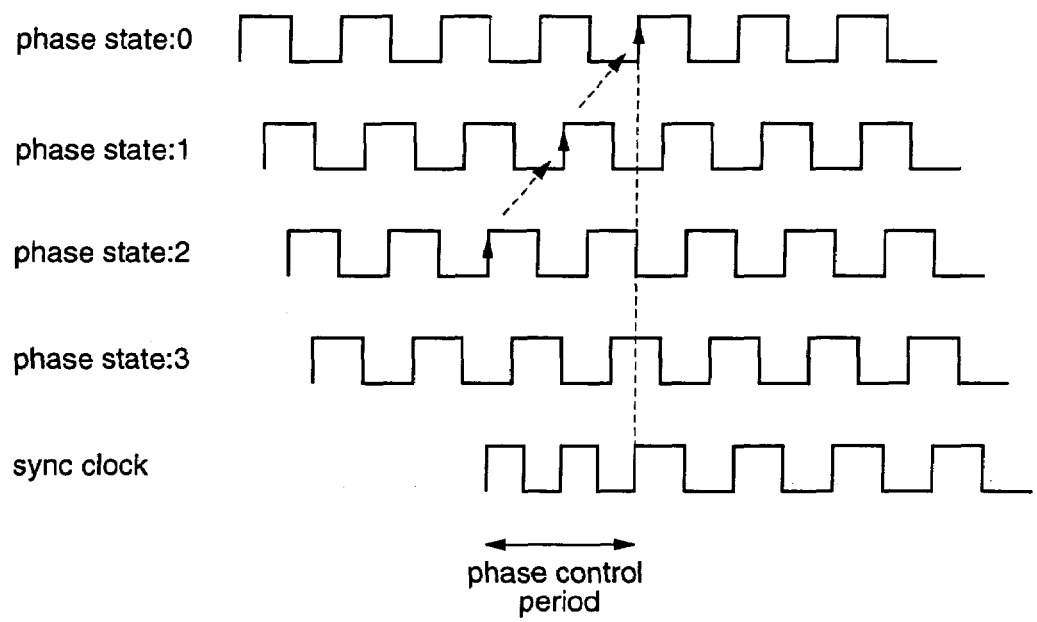
FIG. 11(b) is a diagram for explaining a method for performing phase control of the present reference signal shown in FIG. 11(a).

Based on the result of the detection, when the phase state of the previous reference signal is 0 and the phase state of the present reference signal is 2 as shown in FIG. 11(a), the phase control circuit 16 counts down the number of clocks in units of 1/M-lines to bring the phase of the clock of the present reference signal close to the phase of the previous reference signal at a 3/4 clock rate interval. That is, as shown in FIG. 11(b), the number of clocks is counted down in units of 1/M-lines to change the clock edge of the present reference signal in the phase state 2 to the clock edge in the phase state 1 and to the clock edge in the phase state 0, successively, thereby bringing the phase state of the present reference signal close to that of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control for the clock of the present reference signal, and it is outputted at a 1 clock rate interval after the phases of the previous reference signal and the present reference signal coincide with each other, i.e., after the phase control is completed.

Figure 12A:
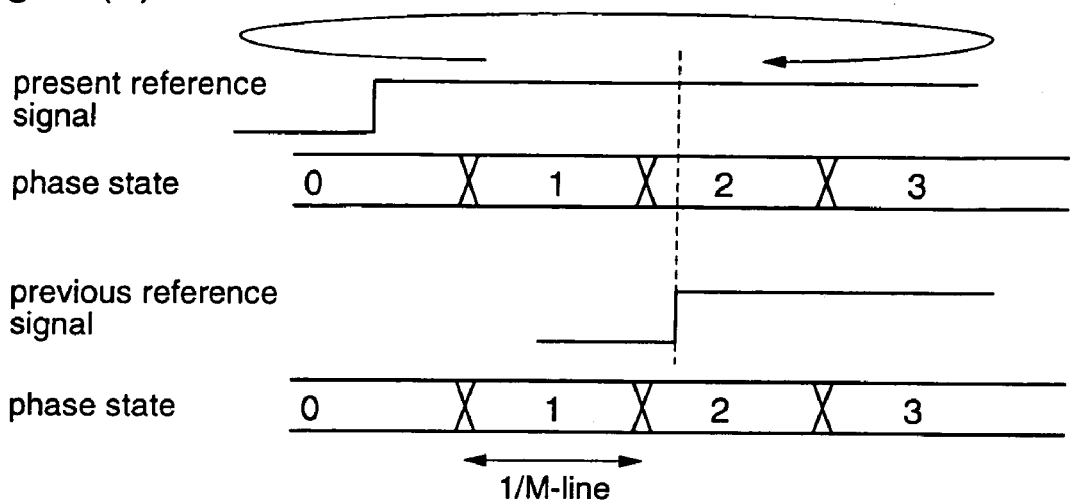
FIG. 12(a) is a diagram illustrating examples of phase states of a present reference signal and a previous reference signal in the semiconductor device according to the fourth embodiment.
Figure 12B:
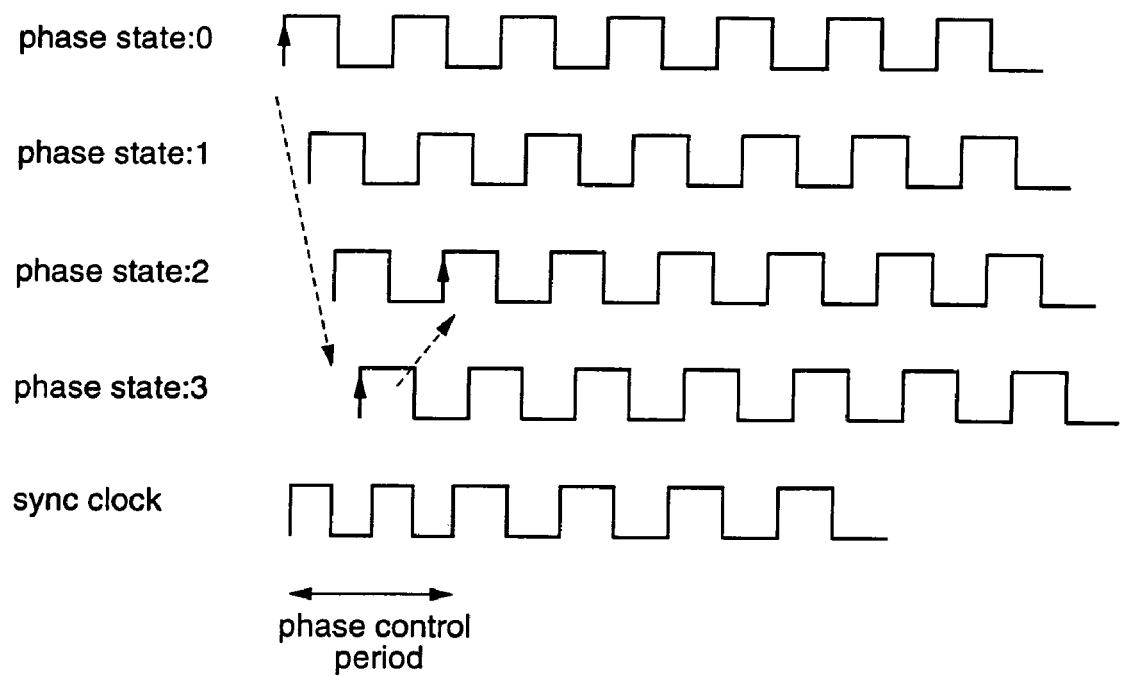
FIG. 12(b) is a diagram for explaining a method for performing phase control of the present reference signal shown in FIG. 12(a).

Based on the result of the detection, when the phase state of the previous reference signal is 2 and the phase state of the present reference signal is 0 as shown in FIG. 12(a), the phase control circuit 16 phase-shifts the clock edge of the present reference signal in the phase state 0 3/4-clock by 3/4-clock as shown in FIG. 12(b) to change the clock edge of the present reference signal to the clock edge in the phase state 3 and to the clock edge of the phase state 2, successively, thereby bringing the phase of the present reference signal close to the phase state of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control, and it is outputted at a 1 clock rate interval after the phases of the previous reference signal and the present reference signal coincide with each other, i.e., after the phase control is completed.

According to the fourth embodiment, the semiconductor device is provided with the phase control circuit 16 which performs phase control by counting down the number of clocks in units of 1/M-lines so as to bring the phase state of the present reference signal close to the phase state of the previous reference signal, and the phase of the clock of the present reference signal is shifted at a 3/4 clock rate interval to make it coincide with the phase of the previous reference signal when the signal that is not synchronized with the clock, e.g., an analog H pulse, is reset. Therefore, the duty of the output sync clock can always be kept constant, whereby the timing constraint at an interface with a subsequent LSI can be significantly reduced, and omission of signals during calculations in signal processing is avoided, and consequently, the timing constraint can be satisfied between data and clocks.

Embodiment 5

Figure 13:
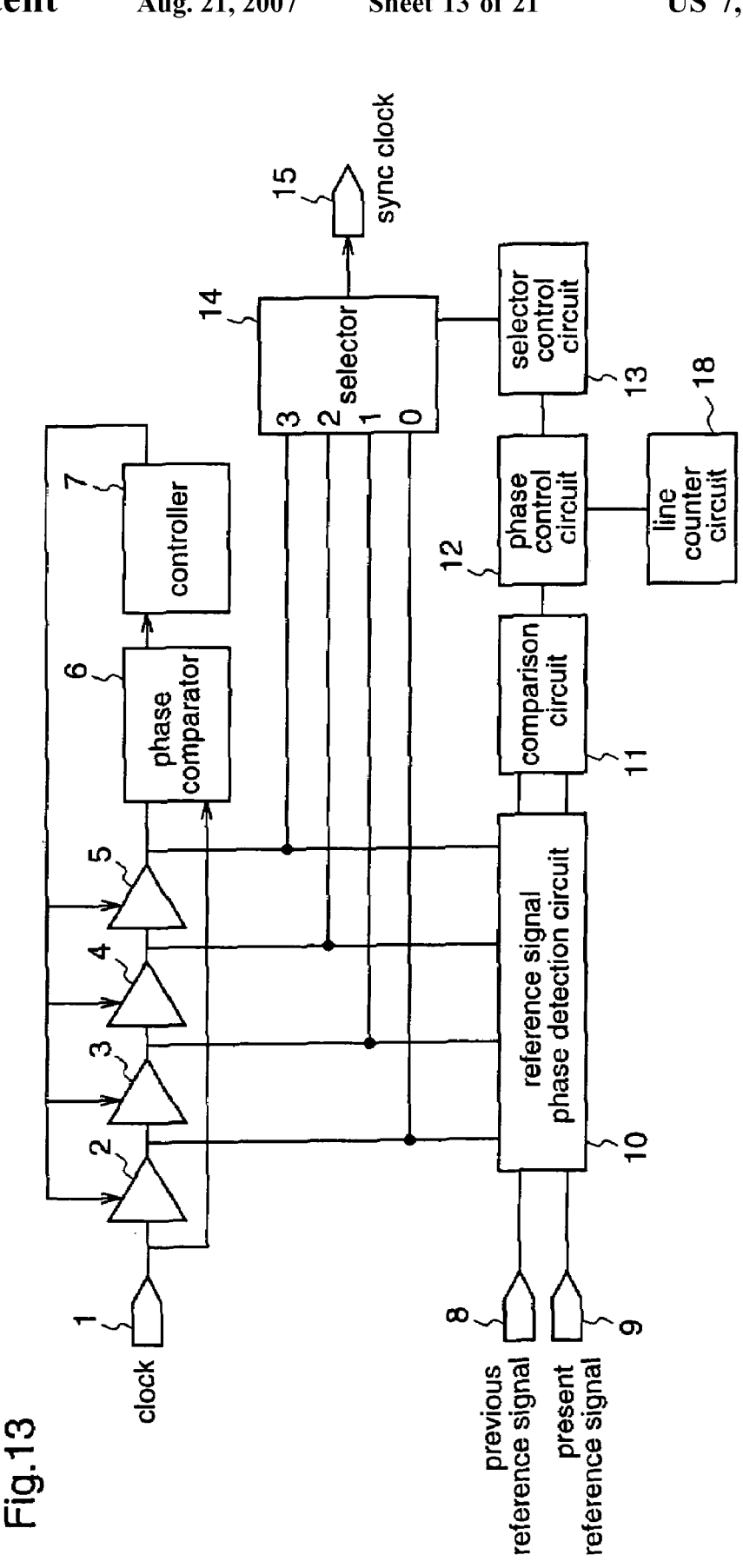
FIG. 13 is a block diagram illustrating the construction of a semiconductor device according to a fifth embodiment of the present invention.

FIG. 13 is a block diagram illustrating the construction of a semiconductor device according to a fifth embodiment of the present invention. In FIG. 13, the same reference numerals as those shown in FIG. 1 denote the same or corresponding components, and therefore, repeated description is not necessary.

The semiconductor device according to the fifth embodiment is provided with a line counter circuit 18 in addition to the components of the semiconductor device according to the first embodiment.

The line counter circuit 18 controls the phase control circuit 12 so as to count the number of clocks line by line.

Next, a description will be given of a phase control method for the present reference signal in the semiconductor device according to the fifth embodiment.

In the reference signal phase detection circuit 10, the phase states of the previous reference signal and the present reference signal are detected on the basis of the phase differences between the output clocks of the respective delay cells 2 to 5 and the previous reference signal, and the phase differences between the output clocks of the respective delay cells 2 to 5 and the present reference signal.

Figure 14A:
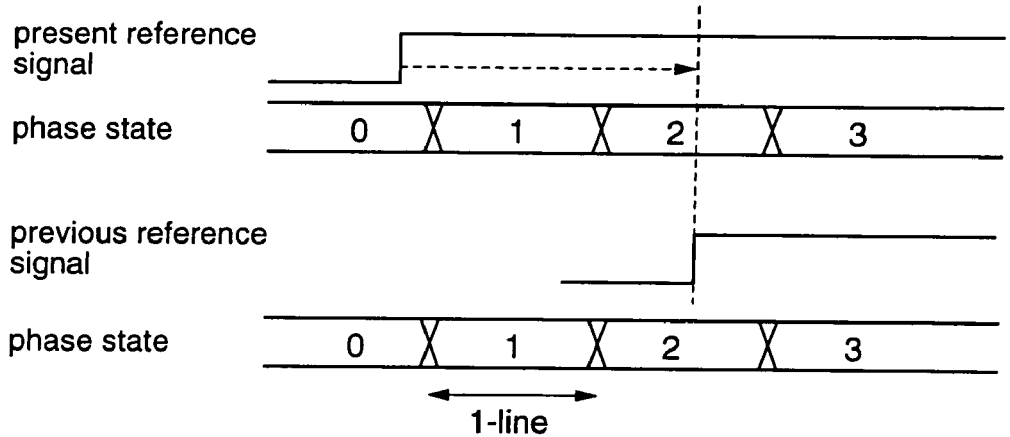
FIG. 14(a) is a diagram illustrating examples of phase states of a present reference signal and a previous reference signal in the semiconductor device according to the fifth embodiment.
Figure 14B:
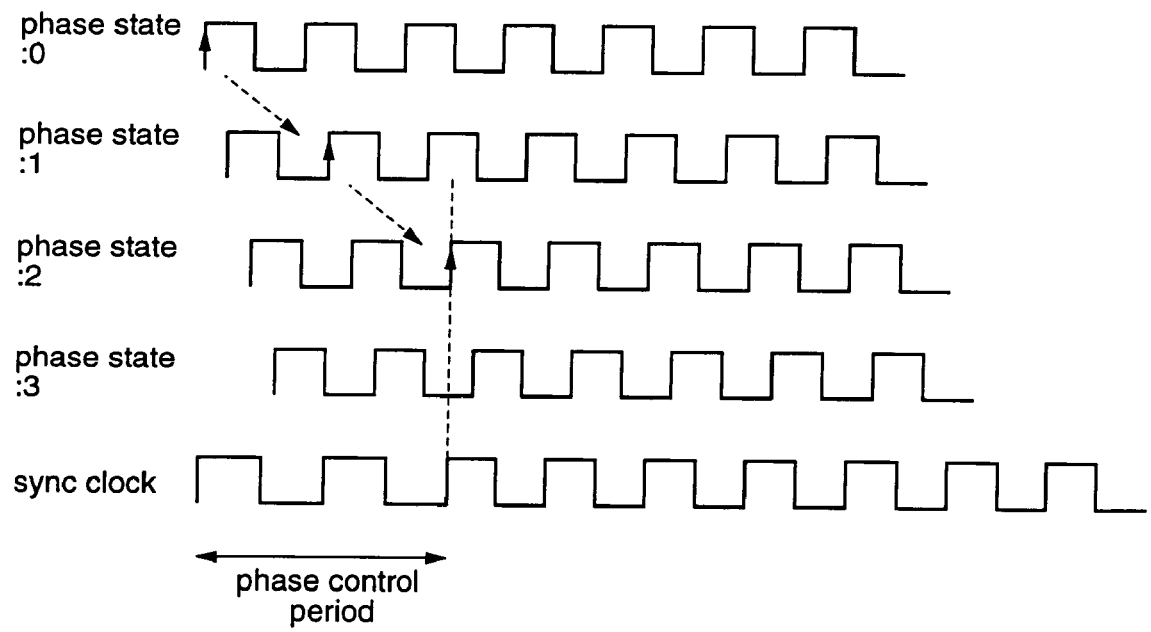
FIG. 14(b) is a diagram for explaining a method for performing phase control of the present reference signal shown in FIG. 14(a).

Based on the result of the detection, when the phase state of the previous reference signal is 2 and the phase state of the present reference signal is 0 as shown in FIG. 14(a), the phase control circuit 12 counts up the number of clocks line by line to bring the phase of the clock of the present reference signal close to the phase of the previous reference signal at a 5/4 clock rate interval. That is, as shown in FIG. 14(b), the clock edge of the present reference signal in the phase state 0 is phase-shifted 5/4-clock by 5/4-clock to change the clock edge of the present reference signal to the clock edge in the phase state 1 and to the clock edge in the phase state 2, successively, so as to bring the phase state of the present reference signal close to that of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control, and it is outputted at a 1 clock rate interval after the phases of the previous reference signal and the present reference signal coincide with each other, i.e., after the phase control is completed.

Figure 15A:
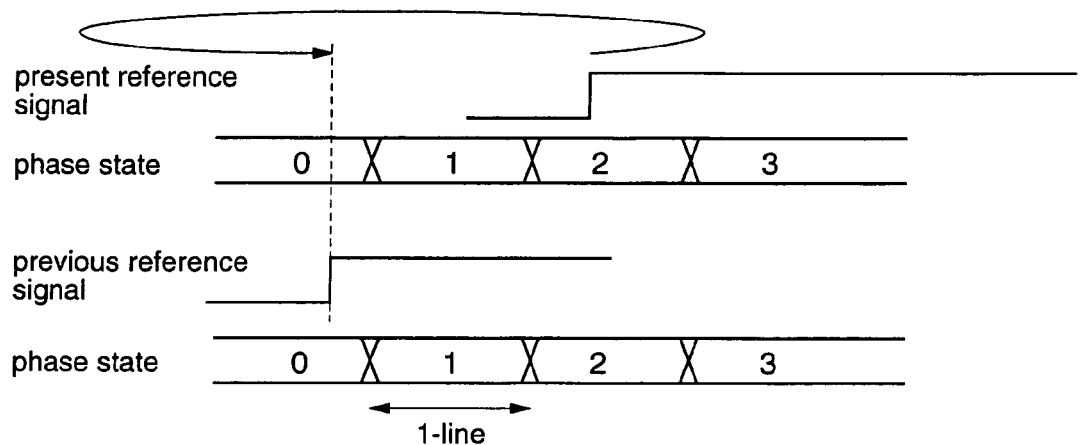
FIG. 15(a) is a diagram illustrating examples of phase states of a present reference signal and a previous reference signal in the semiconductor device according to the fifth embodiment.
Figure 15B:
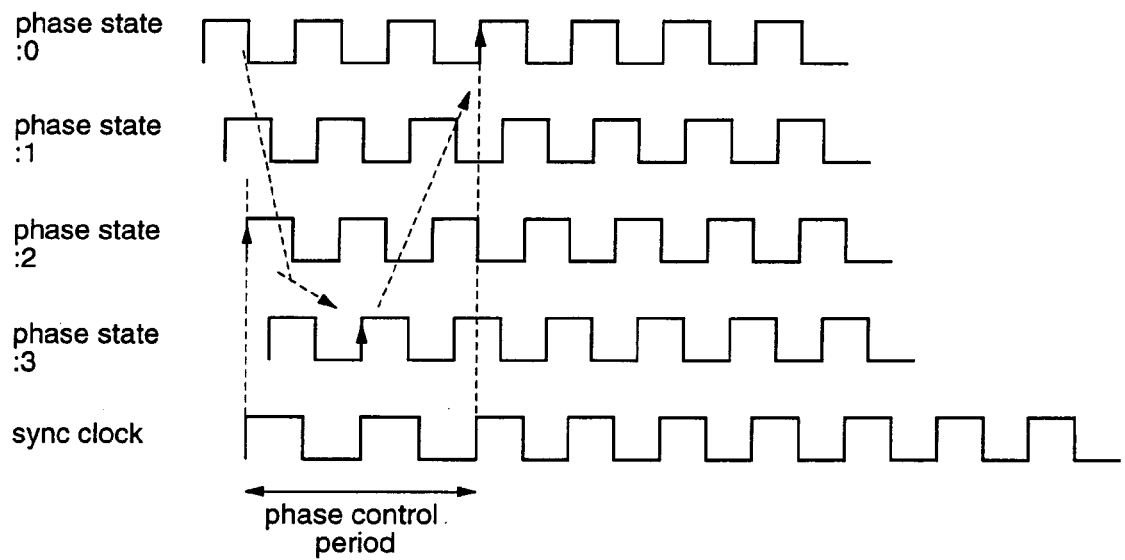
FIG. 15(b) is a diagram for explaining a method for performing phase control of the present reference signal shown in FIG. 15(a).

Based on the result of the detection, when the phase state of the previous reference signal is 0 and the phase state of the present reference signal is 2 as shown in FIG. 15(a), the phase control circuit 12 phase-shifts the clock edge of the present reference signal in the phase state 2 5/4-clock by 5/4-clock as shown in FIG. 15(b) to change the clock edge of the present reference signal to the clock edge in the phase state 3 and to the clock edge in the phase state 0, successively, thereby bringing the phase state of the present reference signal close to that of the previous reference signal.

Then, the selector control circuit 13 controls the selector 14 on the basis of the output of the phase control circuit 12, whereby one of the output clocks of the delay cells 2 to 5 is selectively outputted as a sync clock. The sync clock is outputted at a 5/4 clock rate interval during the phase control, and it is outputted at a 1 clock rate interval after the phases of the previous reference signal and the present reference signal coincide, i.e., after the phase control is completed.

According to the fifth embodiment, the semiconductor device is provided with the phase control circuit 12 which performs phase control by counting up the number of clocks line by line so as to bring the phase state of the present reference signal close to the phase state of the previous reference signal, and the phase of the clock of the present reference signal is shifted at a 5/4 clock rate interval to make it coincide with the phase of the previous reference signal when the signal that is not synchronized with the clock, e.g., an analog H pulse, is reset. Therefore, the duty of the output sync clock can always be kept constant, whereby the timing constraint at an interface with a subsequent LSI can be significantly reduced, and omission of signals during calculations in signal processing is avoided, and consequently, the timing constraint can be satisfied between data and clocks.

Embodiment 6

Figure 16:
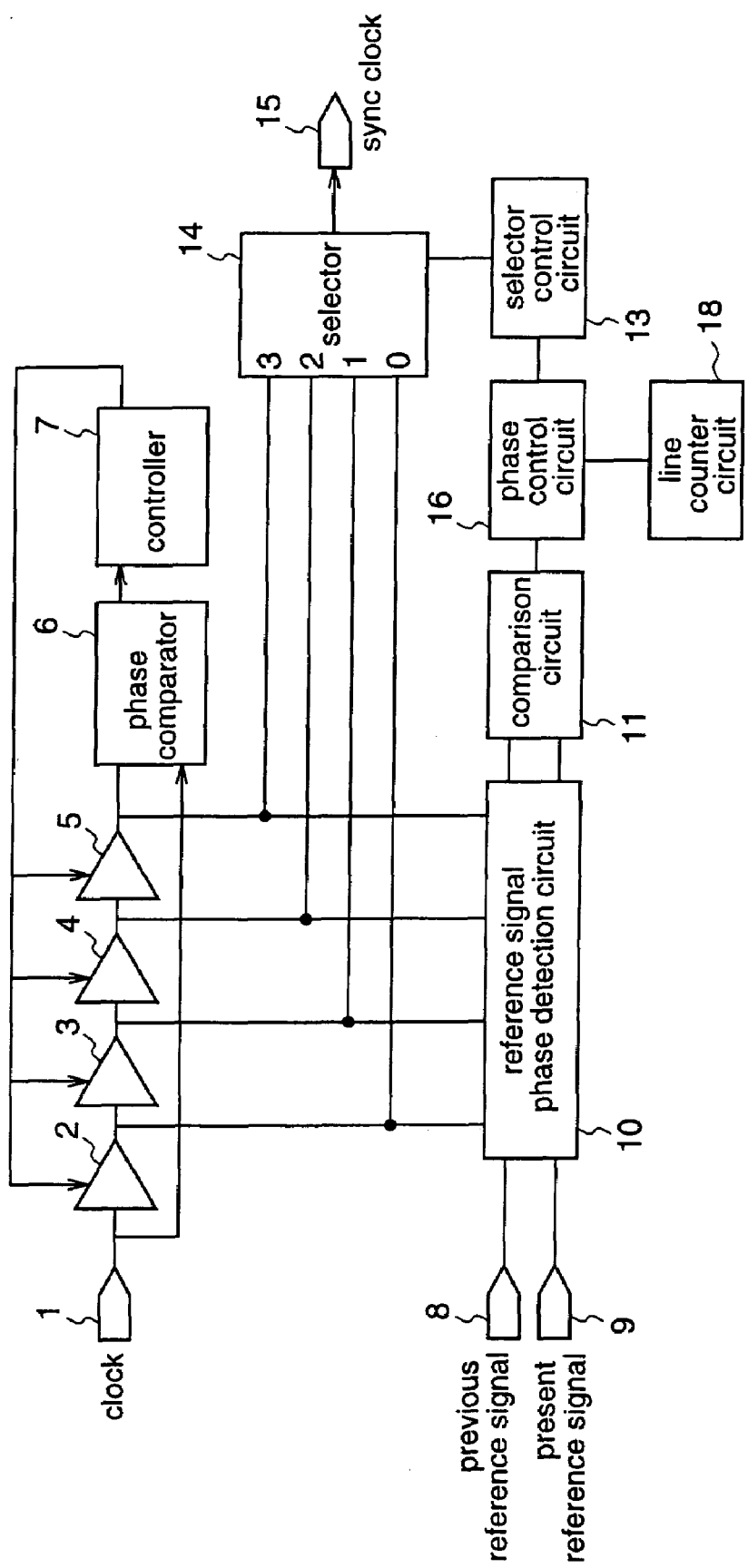
FIG. 16 is a block diagram illustrating the construction of a semiconductor device according to a sixth embodiment of the present invention.

FIG. 16 is a block diagram illustrating the construction of a semiconductor device according to a sixth embodiment of the present invention. In FIG. 16, the same reference numerals as those shown in FIG. 1 denote the same or corresponding components, and therefore, repeated description is not necessary.

The semiconductor device according to the fifth embodiment is provided with a line counter circuit 18 in addition to the components of the semiconductor device according to the second embodiment.

The line counter circuit 18 controls the phase control circuit 12 so as to count the number of clocks line by line.

Next, a description will be given of a phase control method for the present reference signal in the semiconductor device according to the sixth embodiment.

In the reference signal phase detection circuit 10, the phase states of the previous reference signal and the present reference signal are detected on the basis of the phase differences between the output clocks of the respective delay cells 2 to 5 and the previous reference signal, and the phase differences between the output clocks of the respective delay cells 2 to 5 and the present reference signal.

Figure 17A:
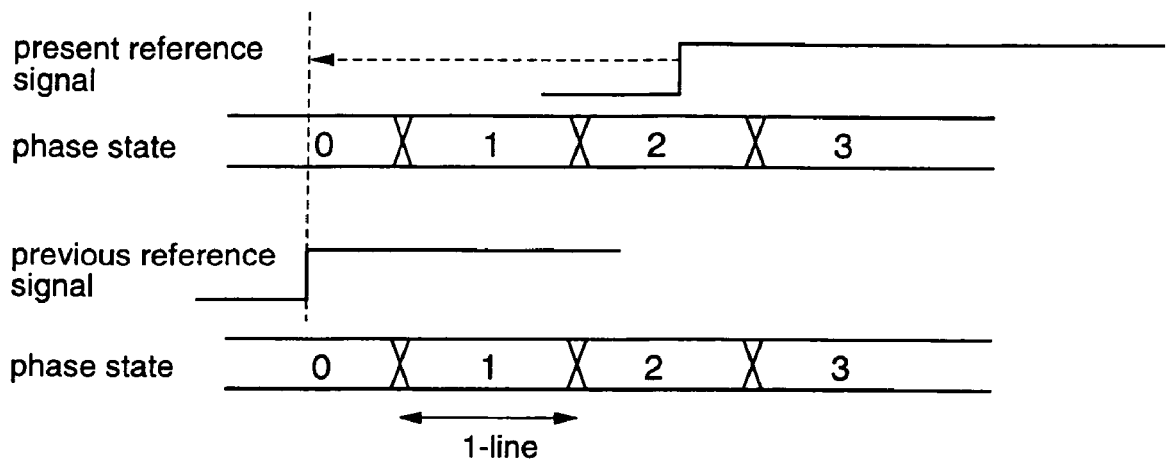
FIG. 17(a) is a diagram illustrating examples of phase states of a present reference signal and a previous reference signal in the semiconductor device according to the sixth embodiment.
Figure 17B:
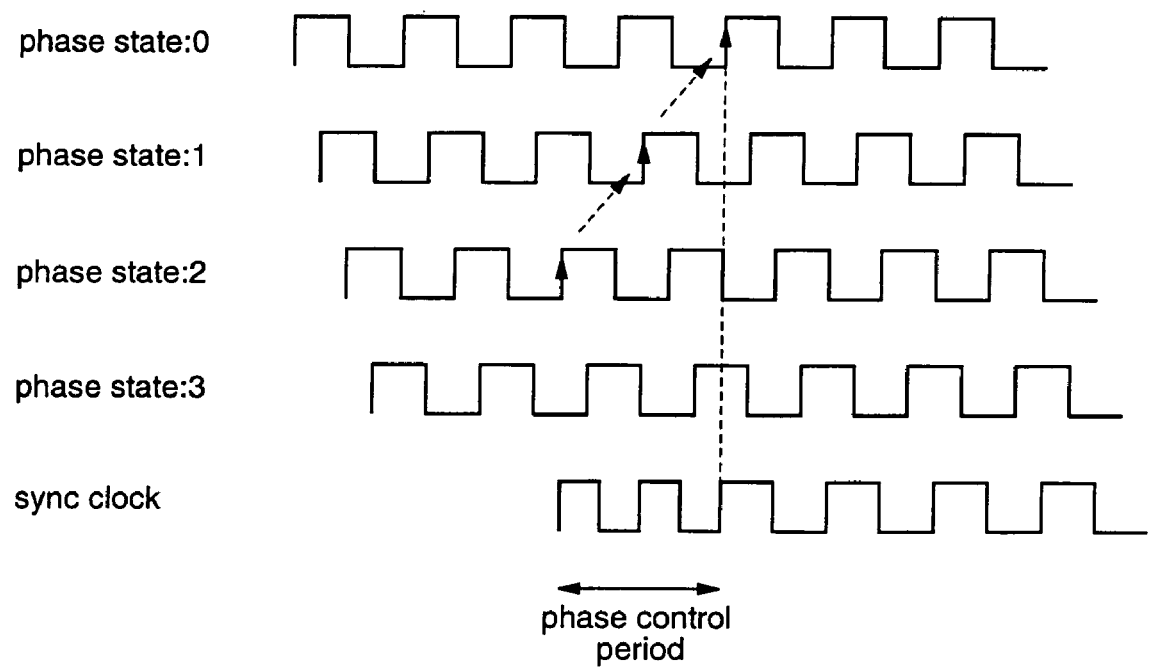
FIG. 17(b) is a diagram for explaining a method for performing phase control of the present reference signal shown in FIG. 17(a).
Figure 18A:
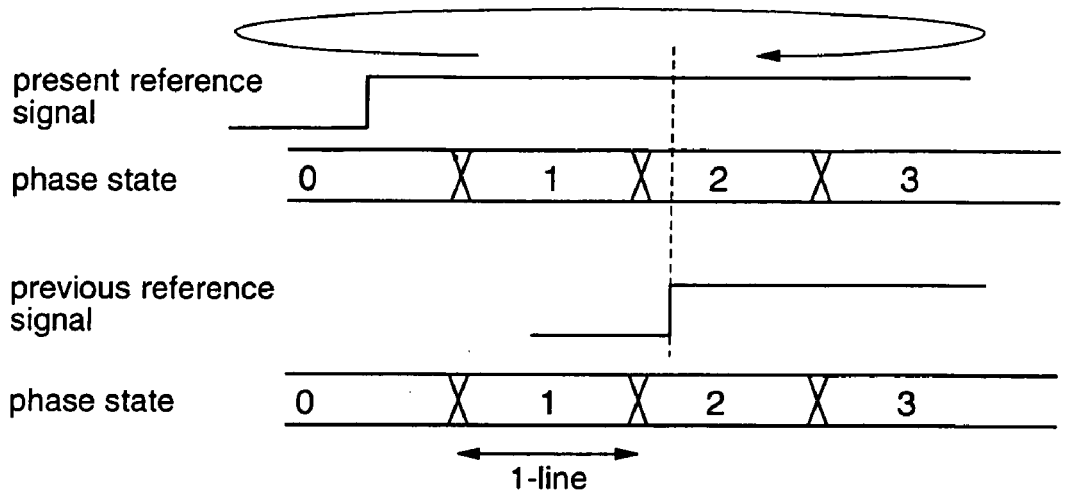
FIG. 18(a) is a diagram illustrating examples of phase states of a present reference signal and a previous reference signal in the semiconductor device according to the sixth embodiment.
Figure 18B:
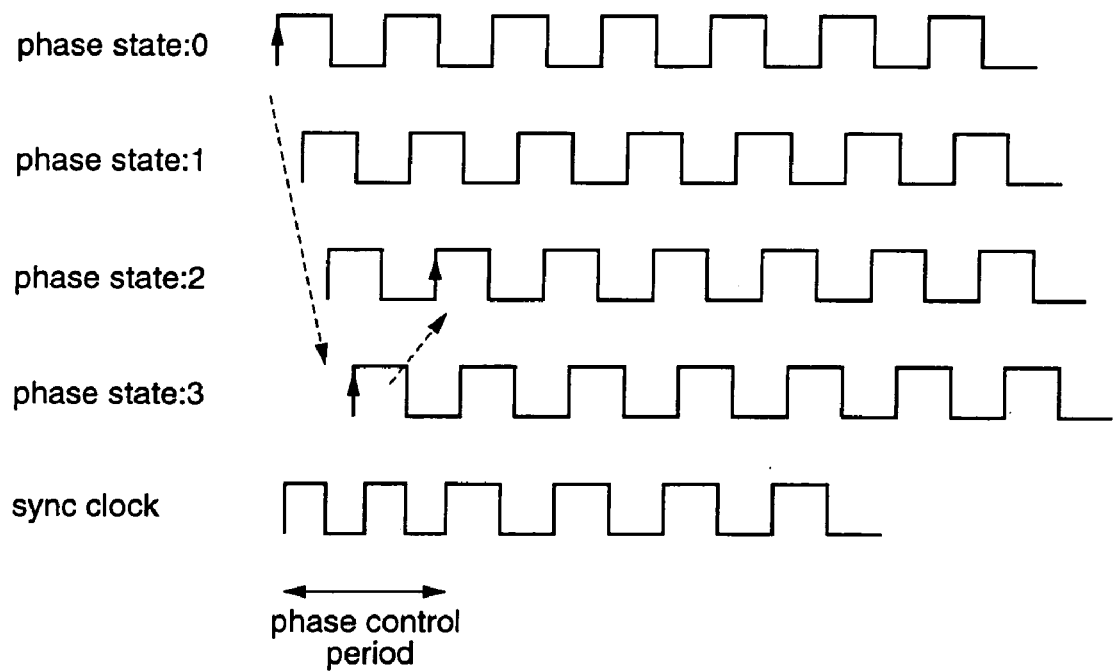
FIG. 18(b) is a diagram for explaining a method for performing phase control of the present reference signal shown in FIG. 18(a).

Based on the result of the detection, when the phase state of the previous reference signal is 0 and the phase state of the present reference signal is 2 as shown in FIG. 17(a), the phase control circuit 16 counts up the number of clocks line by line to bring the phase of the clock of the present reference signal close to the phase of the previous reference signal at a 3/4 clock rate interval. That is, as shown in FIG. 17(b), the clock edge of the present reference signal in the phase state 2 is phase-shifted 3/4-clock by 3/4-clock to change the clock edge of the present reference signal to the clock edge in the phase state 1 and to the clock edge in the phase state 0, successively, so as to bring the phase state of the present reference signal close to that of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control, and it is outputted at a 1 clock rate interval after the phases of the previous reference signal and the present reference signal coincide with each other, i.e., after the phase control is completed.

Based on the result of the detection, when the phase state of the previous reference signal is 0 and the phase state of the present reference signal is 2 as shown in FIG. 15(a), the phase control circuit 12 phase-shifts the clock edge of the present reference signal in the phase state 2 5/4-clock by 5/4-clock as shown in FIG. 15(b) to change the clock edge of the present reference signal to the clock edge in the phase state 3 and to the clock edge in the phase state 0, successively, thereby bringing the phase state of the present reference signal close to that of the previous reference signal.

Then, the selector control circuit 13 controls the selector 14 on the basis of the output of the phase control circuit 16, whereby one of the output clocks of the delay cells 2 to 5 is selectively outputted as a sync clock. The sync clock is outputted at a 3/4 clock rate interval during the phase control, and it is outputted at a 1 clock rate interval after the phases of the previous reference signal and the present reference signal coincide, i.e., after the phase control is completed.

According to the sixth embodiment, the semiconductor device is provided with the phase control circuit 16 which performs phase control by counting up the number of clocks line by line so as to bring the phase state of the present reference signal close to the phase state of the previous reference signal, and the phase of the clock of the present reference signal is shifted at a 3/4 clock rate interval to make it coincide with the phase of the previous reference signal when the signal that is not synchronized with the clock, e.g., an analog H pulse, is reset. Therefore, the duty of the output sync clock can always be kept constant, whereby the timing constraint at an interface with a subsequent LSI can be significantly reduced, and omission of signals during calculations in signal processing is avoided, and consequently, the timing constraint can be satisfied between data and clocks.

A highly reliable semiconductor device can be realized by combining the first to sixth embodiments as desired to perform phase control of reference signals.

For example, an example of construction of a semiconductor device obtained by combining the first embodiment and the fifth embodiment is shown in FIG. 19. The semiconductor device shown in FIG. 19 is provided with a switching means 19 for controlling the phase control circuit 12 to perform counting line by line or clock by clock, in addition to the semiconductor device according to the first embodiment.

When phase control of reference signals is started using the semiconductor device thus constructed, the phase control circuit 12 is controlled by the switching means 190 to carry out phase control line by line, and the phase state of the present reference signal is successively changed by counting up the number of clocks line by line as described for the fifth embodiment to bring the phase state of the present reference signal to that of the previous reference signal.

When the phase of the present reference signal gets close to the phase of the previous reference signal, the phase control circuit 12 is controlled by the switching means 19 so as to perform phase control clock by clock. Then, as described for the first embodiment, the phase state of the clock of the present reference signal is made to coincide with the phase state of the previous reference signal while counting up the number of clocks clock by clock.

As described above, rough phase control is carried out line by line when phase control is started, and thereafter, phase control is precisely carried out clock by clock, whereby the phase state of the previous reference signal can be made to coincide with the phase state of the present reference signal.

APPLICABILITY IN INDUSTRY

A semiconductor device according to the present invention is useful as a semiconductor device which can keep the duty width of a sync clock to be outputted constant when synchronizing the clock to a reference signal such as an analog H pulse.

The invention claimed is:

1. A semiconductor device comprising:

N stages of delay cells, each of the N delay cells delaying an input clock signal by 1/N clock period and outputting the respective delayed clock signal;

a reference signal phase detection circuit for detecting a phase state of a present reference signal based on phase differences between the clocks outputted from the delay cells and the present reference signal, and detecting a phase state of a previous reference signal based on phase differences between the clocks outputted from the delay cells and the previous reference signal;

a comparison circuit for comparing the phase state of the present reference signal and the phase state of the previous reference signal which are detected by the reference signal phase detection circuit;

a phase control circuit for shifting the phase state of the present reference signal to make it coincide with the phase state of the previous reference signal, when the comparison circuit detects that the phase states of the present reference signal and the previous reference signal do not coincide with each other;

a selector; and a selector control circuit for controlling the selector based on the output of the phase control circuit to select a clock which is most synchronized with the shifted phase state of the present reference signal from among clocks outputted from the respective delay cells, and to output the selected clock as a sync clock.

2. A semiconductor device as defined in claim 1 wherein said phase control circuit performs the phase control by counting up the number of clocks stepwisely.

3. A semiconductor device as defined in claim 1 wherein said phase control circuit performs the phase control by counting down the number of clocks stepwisely.

4. A semiconductor device as defined in claim 1 wherein said phase control circuit shifts the phase of the clock of the present reference signal at a clock rate interval equivalent to a (1+N)/N clock so as to bring the phase of the present reference signal close to the phase of the previous reference signal.

5. A semiconductor device as defined in claim 1 wherein said phase control circuit shifts the phase of the clock of the present reference signal at a clock rate interval equivalent to a (N−1)/N clock so as to bring the phase of the present reference signal close to the phase of the previous reference signal.

6. A semiconductor device as defined in claim 1 wherein said phase control circuit shifts the phase of the clock of the present reference signal so that the clock rate interval becomes equal to or larger than one clock to bring the phase of the present reference signal close to the phase of the previous reference signal.

7. A semiconductor device as defined in claim 1 wherein said phase control circuit shifts the phase of the clock of the present reference signal so that the clock rate interval becomes equal to or smaller than one clock to bring the phase of the present reference signal close to the phase of the previous reference signal.

8. A semiconductor device as defined in claim 1 wherein said phase control circuit counts the number of clocks clock by clock, and performs the phase control on the basis of the count value.

9. A semiconductor device as defined in claim 1 wherein said phase control circuit counts the number of clocks in units of 1/M-lines, wherein M is an integer not less than 2, and performs the phase control on the basis of the count value.

10. A semiconductor device as defined in claim 1 wherein said phase control circuit counts the number of clocks line by line, and performs the phase control on the basis of the count value.

* * * * *